United States Patent
Tran et al.

(10) Patent No.: US 10,134,475 B2
(45) Date of Patent: Nov. 20, 2018

(54) METHOD AND APPARATUS FOR INHIBITING THE PROGRAMMING OF UNSELECTED BITLINES IN A FLASH MEMORY SYSTEM

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/048,707

(22) Filed: Feb. 19, 2016

(65) Prior Publication Data

US 2016/0293260 A1    Oct. 6, 2016

Related U.S. Application Data

(60) Provisional application No. 62/141,082, filed on Mar. 31, 2015.

(51) Int. Cl.
| | |
|---|---|
| *G11C 16/24* | (2006.01) |
| *G11C 16/14* | (2006.01) |
| *G11C 16/12* | (2006.01) |
| *G11C 16/04* | (2006.01) |
| *G11C 16/26* | (2006.01) |
| *G11C 16/10* | (2006.01) |
| *G11C 16/34* | (2006.01) |
| *G11C 16/16* | (2006.01) |

(52) U.S. Cl.
CPC ............ *G11C 16/14* (2013.01); *G11C 16/04* (2013.01); *G11C 16/0433* (2013.01); *G11C 16/10* (2013.01); *G11C 16/12* (2013.01); *G11C 16/16* (2013.01); *G11C 16/24* (2013.01); *G11C 16/26* (2013.01); *G11C 16/3427* (2013.01)

(58) Field of Classification Search
CPC .................. G11C 16/12; G11C 16/24
USPC ....................................... 365/185.15
See application file for complete search history.

(56) References Cited

U.S. PATENT DOCUMENTS

| | | | |
|---|---|---|---|
| 6,219,279 B1* | 4/2001 | Manolescu | G11C 16/10 365/185.18 |
| 6,747,310 B2 | 6/2004 | Fan et al. | |
| 6,765,825 B1 | 7/2004 | Scott | |
| 7,190,622 B2* | 3/2007 | Roohparvar | G11C 7/1051 365/185.21 |
| 7,868,375 B2 | 1/2011 | Liu et al. | |
| 8,345,481 B2 | 1/2013 | Lee | |
| 2004/0065917 A1* | 4/2004 | Fan | H01L 27/11521 257/315 |
| 2005/0219914 A1 | 10/2005 | Sarin | |

(Continued)

*Primary Examiner* — Hoai V Ho
*Assistant Examiner* — Jay Radke
(74) *Attorney, Agent, or Firm* — Brent Yamashita; DLA Piper LLP US

(57) ABSTRACT

Various embodiments for inhibiting the programming of memory cells coupled to unselected bit lines while programming a memory cell coupled to a selected bit line in a flash memory array are disclosed. Various embodiments for compensating for leakage current during the programming of memory cells coupled to a selected bit line in a flash memory array also are disclosed.

14 Claims, 46 Drawing Sheets

(56) References Cited

U.S. PATENT DOCUMENTS

| | | | | |
|---|---|---|---|---|
| 2005/0286302 | A1* | 12/2005 | O | G11C 5/145 |
| | | | | 365/185.18 |
| 2006/0245262 | A1* | 11/2006 | Li | G11C 16/10 |
| | | | | 365/185.28 |
| 2007/0147128 | A1* | 6/2007 | Edahiro | G11C 7/12 |
| | | | | 365/185.21 |
| 2007/0171727 | A1* | 7/2007 | Choi | G11C 16/30 |
| | | | | 365/185.23 |
| 2008/0094901 | A1* | 4/2008 | Park | G11C 16/3427 |
| | | | | 365/185.12 |
| 2008/0170442 | A1 | 7/2008 | Bedarida | |
| 2009/0097323 | A1* | 4/2009 | Bode | G11C 5/147 |
| | | | | 365/185.21 |
| 2009/0108328 | A1* | 4/2009 | Widjaja | H01L 27/115 |
| | | | | 257/320 |
| 2012/0243294 | A1* | 9/2012 | Kaneko | G11C 8/08 |
| | | | | 365/148 |

\* cited by examiner

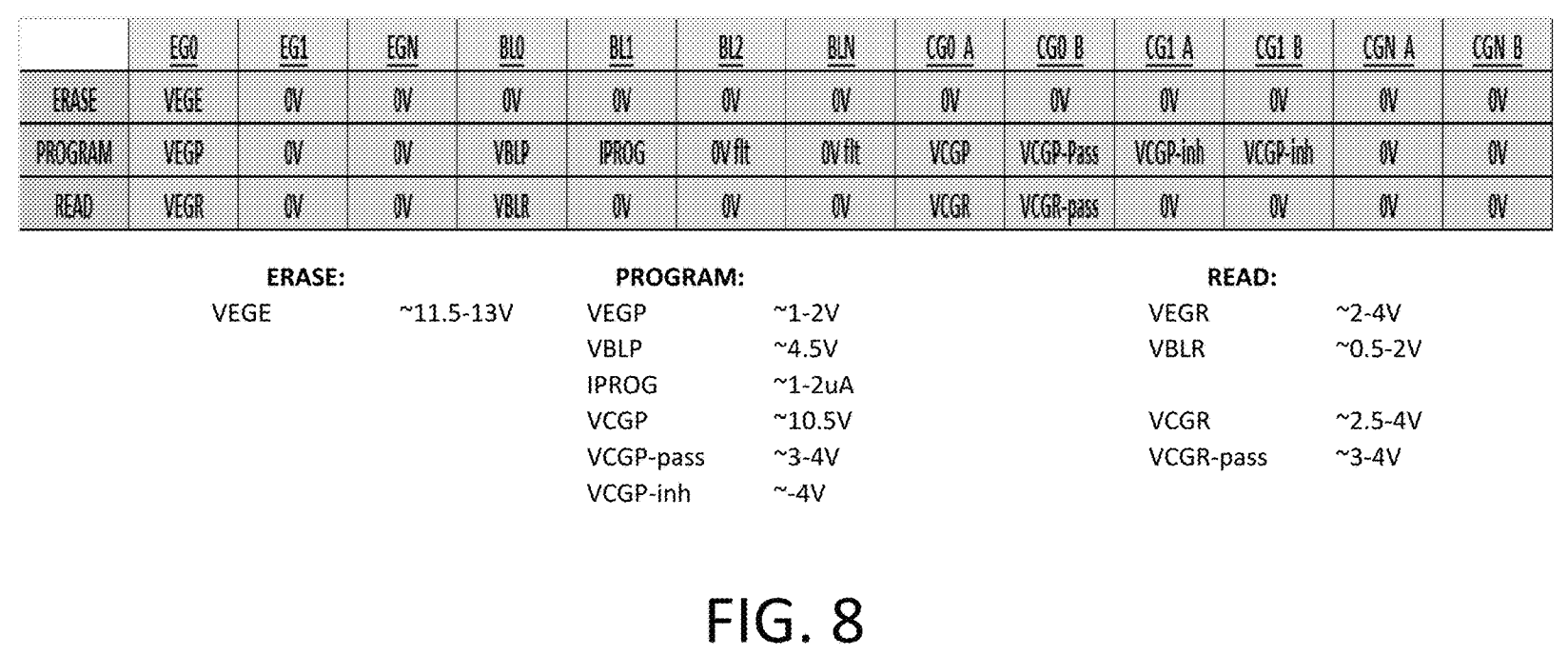

| | EG0 | EG1 | EGN | BL0 | BL1 | BL2 | BLN | CG0 A | CG0 B | CG1 A | CG1 B | CGN A | CGN B |
|---|---|---|---|---|---|---|---|---|---|---|---|---|---|
| ERASE | VEGE | 0V | 0V | 0V | 0V | 0V | 0V | 0V | 0V | 0V | 0V | 0V | 0V |
| PROGRAM | VEGP | 0V | 0V | VBLP | IPROG | 0V/fit | 0V/fit | VCGP | VCGP-Pass | VCGP-inh | VCGP-inh | 0V | 0V |
| READ | VEGR | 0V | 0V | VBLR | 0V | 0V | 0V | VCGR | VCGR-pass | 0V | 0V | 0V | 0V |

ERASE:
VEGE  ~11.5-13V

PROGRAM:
VEGP        ~1-2V
VBLP        ~4.5V
IPROG       ~1-2uA
VCGP        ~10.5V
VCGP-pass   ~3-4V
VCGP-inh    ~4V

READ:
VEGR        ~2-4V
VBLR        ~0.5-2V
VCGR        ~2.5-4V
VCGR-pass   ~3-4V

FIG. 8

| | EG0 | EG1 | EGN | BL0 | BL1 | BL2 | BLN | CG0 A | CG0 B | CG1 A | CG1 B | CGN A | CGN B |
|---|---|---|---|---|---|---|---|---|---|---|---|---|---|
| ERASE | VEGE | 0V | 0V | 0V | 0V | 0V | 0V | VEGE | VEGE | VEGE | VEGE | VEGE | VEGE |
| PROGRAM | VEGP | 0V | 0V | VBLP | IPROG | 0V/Inh | 0V/Inh | VCGP | VCGP-Pass | VEGP-inh | VCGP-inh | 0V | 0V |
| READ | VEGR | 0V | 0V | VBLR | 0V | 0V | 0V | VCGR | VCGR-pass | 0V | 0V | 0V | 0V |

ERASE:
VEGE  ~7-9V

VCGE  ~7 to -8V

PROGRAM:
VEGP  ~1-2V
VBLP  ~4.5V
IPROG  ~1-2uA
VCGP  ~10.5V
VCGP-pass  ~3-4V
VCGP-inh  ~4V

READ:
VEGR  ~2-4V
VBLR  ~0.5-2V

VCGR  ~2.5-4V
VCGR-pass  ~3-4V

FIG. 9

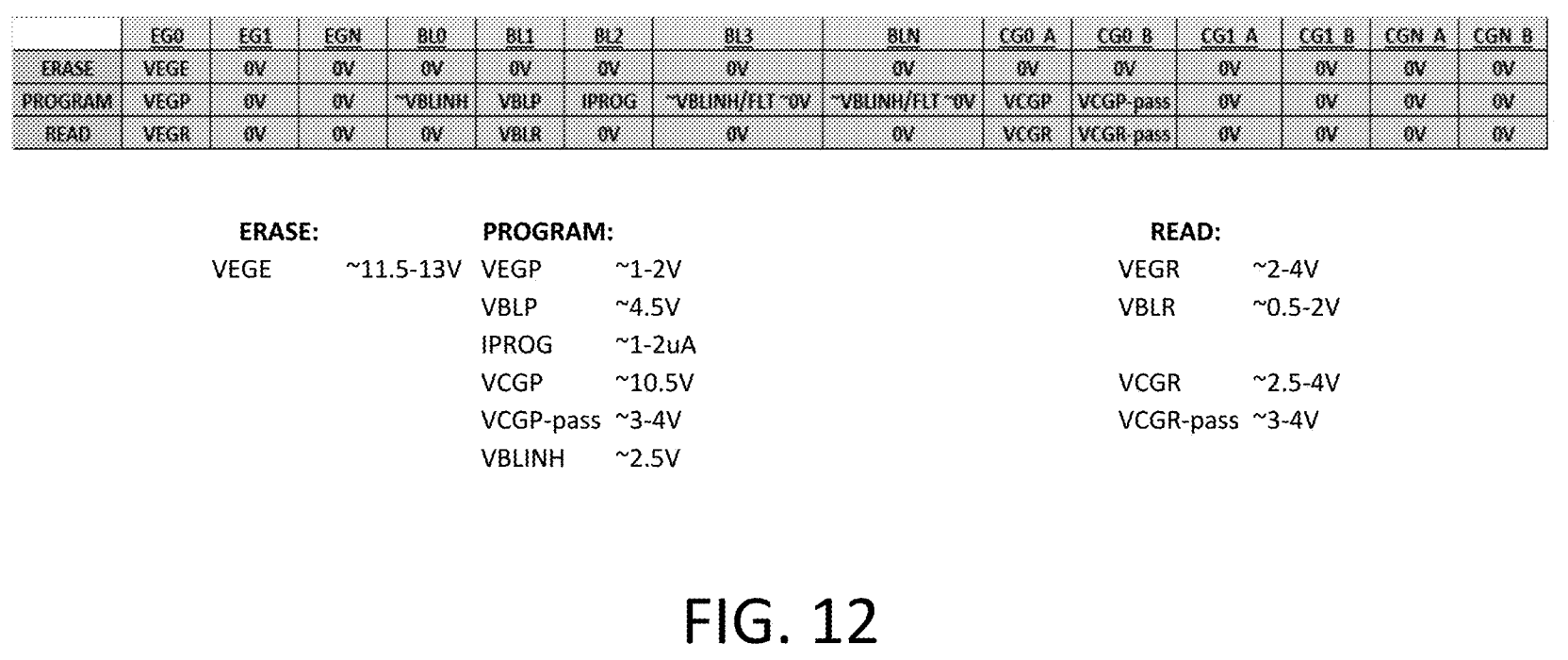

| EG0 | EG1 | EGN | BL0 | BL1 | BL2 | BL3 | BLN | CGB A | CGB B | CG1 A | CG1 B | CGN A | CGN B |
|---|---|---|---|---|---|---|---|---|---|---|---|---|---|
| ERASE | VEGE | 0V | 0V | VBLINH | VBLP | 0V | 0V | ~VBLINH/FLT 0V | ~VBLINH/FLT 0V | 0V | 0V | 0V | 0V | 0V |
| PROGRAM | VEGP | 0V | 0V | 0V | VBLR | IPROG | 0V | 0V | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:
VEGE  ~11.5-13V

PROGRAM:
VEGP       ~1-2V
VBLP       ~4.5V
IPROG      ~1-2uA
VCGP       ~10.5V
VCGP-pass  ~3-4V
VBLINH     ~2.5V

READ:
VEGR       ~2-4V
VBLR       ~0.5-2V

VCGR       ~2.5-4V
VCGR-pass  ~3-4V

FIG. 12

| | EG0 | EG1 | EGN | BL0 | BL1 | BL2 | BL3 | BLN | CG0_A | CG0_B | CG1_A | CG1_B | CGN_A | CGN_B |
|---|---|---|---|---|---|---|---|---|---|---|---|---|---|---|
| ERASE | VEGE | 0V | 0V | VBLINH | VBLR | 0V | 0V | ~VBLINH/FLT 0V | VCGE | VCGE | VCGE | VCGE | VCGE | VCGE |
| PROGRAM | VEGP | 0V | 0V | VBLP | VBLR | IPROG | 0V | ~VBLINH/FLT 0V | VCGP | VCGP-pass | 0V | 0V | 0V | 0V |
| READ | VEGR | 0V | 0V | 0V | 0V | 0V | 0V | 0V | VCGR | VCGR-pass | 0V | 0V | 0V | 0V |

ERASE:
VEGE ~7-9V
VCGE ~-7 to -8V

PROGRAM:
VEGP ~1-2V
VBLP ~4.5V
IPROG ~1-2uA
VCGP ~10.5V
VCGP-pass ~3-4V
VBLINH ~2.5V

READ:
VEGR ~2-4V
VBLR ~0.5-2V
VCGR ~2.5-4V
VCGR-pass ~3-4V

FIG. 13

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | ~VBLINH | VBLP | 0V | 0V | ~VBLINH/FLT | 0V | 0V | 0V | 0V | 0V | 0V |
| PROGRAM | VEGP | 0V | 0V | 0V | VBLR | IPROG | 0V | ~VBLINH/FLT | VCGP | VCGP-pass | 0V | 0V | 0V | 0V |
| READ | VEGR | 0V | 0V | 0V | VBLR | 0V | 0V | 0V | VCGR | VCGR-pass | 0V | 0V | 0V | 0V |

ERASE:  
VEGE  ~11.5-13V

PROGRAM:
VEGP       ~1-2V
VBLP       ~4.5V
IPROG      ~1-2uA
VCGP       ~10.5V
VCGP-pass  ~3-4V
VBLINH     ~2.5V

READ:
VEGR       ~2-4V
VBLR       ~0.5-2V

VCGR       ~2.5-4V
VCGR-pass  ~3-4V

FIG. 17

| | EG0 | EG1 | EGN | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|
| ERASE | VEGE | 0V | 0V | VBLINH | VBLP | IPROG | VBLINH/FLT | VBLINH/FLT 0V | VCGE | VCGE | VCGE | VCGE | VCGE | VCGE |
| PROGRAM | VEGP | 0V | 0V | 0V | VBLP | IPROG | 0V | 0V | VCGP | VCGP-pass | 0V | 0V | 0V | 0V |
| READ | VEGR | 0V | 0V | VBLR | VBLR | 0V | 0V | 0V | VCGR | VCGR-pass | 0V | 0V | 0V | 0V |

ERASE:
VEGE ~7-9V

VCGE ~-7 to -8V

PROGRAM:
VEGP ~1-2V
VBLP ~4.5V
IPROG ~1-2uA
VCGP ~10.5V

VCGP-pass~3-4V
VBLINH ~2.5V

READ:
VEGR ~2-4V
VBLR ~0.5-2V

VCGR ~2.5-4V
VCGR-pass ~3-4V

FIG. 18

| | EG0 | EG1 | EGN | BL0_A | BL0_B | BL1_A | BL1_B | BLN_A | BLN_B | CG0_A | CG0_B | CG1_A | CG1_B | CGN_A | CGN_B |
|---|---|---|---|---|---|---|---|---|---|---|---|---|---|---|---|
| ERASE | VEGE | 0V | 0V | 0V | 0V | 0V | 0V | 0V | 0V | 0V | 0V | 0V | 0V | 0V | 0V |
| PROGRAM | VEGP | 0V | 0V | VBLP | IPROG | ~VBLINH | ~VBLINH | ~VBLINH | ~VBLINH | VCGP | VCGP-pass | 0V | 0V | 0V | 0V |
| READ | VEGR | 0V | 0V | VBLR | 0V | 0V | 0V | 0V | 0V | VCGR | VCGR-pass | 0V | 0V | 0V | 0V |

ERASE:
VEGE     ~11.5-13V

PROGRAM:
VEGP         ~1-2V
VBLP         ~4.5V
IPROG        ~1-2uA
VCGP         ~10.5V
VCGP-pass    ~3-4V
VBLINH       ~2.5V READ:
VEGR         ~2-4V
VBLR         ~0.5-2V
VCGR         ~2.5-4V
VCGR-pass    ~3-4V

FIG. 21

| | EG0 | EG1 | EGN | BL0 A | BL0 B | BL1 A | BL1 B | BLN A | BLN B | CG0 A | CG0 B | CG1 A | CG1 B | CGN A | CGN B |
|---|---|---|---|---|---|---|---|---|---|---|---|---|---|---|---|
| ERASE | VEGE | 0V | 0V | VBLP | IPROG | 0V | 0V | 0V | 0V | VCGE | VCGE | VCGE | VCGE | VCGE | VCGE |
| PROGRAM | VEGP | 0V | 0V | VBLP | 0V | VBLINH | VBLINH | VBLINH | 0V | VCGP | VCGP-pass | 0V | 0V | 0V | 0V |
| READ | VEGR | 0V | 0V | VBLR | 0V | 0V | 0V | 0V | 0V | VCGR | VCGR-pass | 0V | 0V | 0V | 0V |

ERASE:
VEGE  ~7-9V

VCGE  ~-7 to -8V

PROGRAM:
VEGP       ~1-2V
VBLP       ~4.5V
IPROG      ~1-2uA
VCGP       ~10.5V
VCGP-pass  ~3-4V
VBLINH     ~2.5V

READ:
VEGR       ~2-4V
VBLR       ~0.5-2V

VCGR       ~2.5-4V
VCGR-pass  ~3-4V

FIG. 22

| | EGB | EG1 | EGN | BL0 | BL1 | BL2 | BL3 | BLN | EG0_A | CG0_B | CG1_A | CG1_B | CGN_A | CGN_B |
|---|---|---|---|---|---|---|---|---|---|---|---|---|---|---|
| ERASE | VEGE | 0V | 0V | FLT~0V/VBLINH | 0V | 0V | 0V | VBLINH/FLT~0V | 0V | 0V | 0V | 0V | 0V | 0V |
| PROGRAM | VEGP | 0V | 0V | IPROG | 0V | VBLP | VBLINH/FLT~0V | -VBLINH/FLT~0V | VCGP | VCGP-pass | 0V | 0V | 0V | 0V |
| READ | VEGR | 0V | 0V | 0V/VBLR | VBLR/0V | 0V | 0V | 0V | VCGR | VCGR-pass | 0V | 0V | 0V | 0V |

ERASE:

VEGE    ~11.5-13V

PROGRAM:

VEGP    ~1-2V
VBLP    ~4.5V
IPROG    ~1-2uA
VCGP    ~10.5V
VCGP-pass    ~3-4V
VBLINH    ~2.5V

READ:

VEGR    ~2-4V
VBLR    ~0.5-2V
VCGR    ~2.5-4V
VCGR-pass    ~3-4V

FIG. 26

| | EG0 | EG1 | EGN | BL0 | BL1 | BL2 | BL3 | BLN | CG0_A | CG0_B | CG1_A | CG1_B | CGN_A | CGN_B |
|---|---|---|---|---|---|---|---|---|---|---|---|---|---|---|
| ERASE | VEGE | 0V | 0V | FLT-0V/VBLINH | 0V | 0V | 0V | VBLINH/FLT-0V | VCGE | VCGE | VCGE | VCGE | VCGE | VCGE |
| PROGRAM | VEGP | 0V | 0V | 0V | IPROG | VBLP | VBLINH/FLT-0V | VBLINH/FLT-0V | VCGP | VCGP-pass | 0V | 0V | 0V | 0V |
| READ | VEGR | 0V | 0V | 0V | 0V/VBLR | VBLR/0V | 0V | 0V | VCGR | VCGR-pass | 0V | 0V | 0V | 0V |

ERASE:
VEGE    ~7-9V
VCGE    ~-7 to -8V

PROGRAM:
VEGP        ~1-2V
VBLP        ~4.5V
IPROG       ~1-2uA
VCGP        ~10.5V
VCGP-pass   ~3-4V
VBLINH      ~2.5V

READ:
VEGR        ~2-4V
VBLR        ~0.5-2V
VCGR        ~2.5-4V
VCGR-pass   ~3-4V

FIG. 27

| | EG0 | EG1 | EGN | WL0 | WL1 | ... | BL0 | BL1 | BL2 | BL3 | BLN | CG0 A | CG0 B | CG1 A | CG1 B | CGN A | CGN B |
|---|---|---|---|---|---|---|---|---|---|---|---|---|---|---|---|---|---|
| ERASE | VEGE | 0V | 0V | 0V | 0V | | FLT 0V/VBLINH | 0V/VBLR | VBLP | 0V | VBLINH/FLT 0V | 0V | 0V | 0V | 0V | 0V | 0V |
| PROGRAM | VEGP | 0V | 0V | VWLP | 0V | | 0V | 0V/VBLR | VBLP | 0V | VBLINH/0V | VCGP | VCGP-pass | 0V | VCGINH/0V | 0V | VCGINH/0V |
| READ | VEGR | 0V | 0V | VWLR | 0V | | 0V | 0V | VBLR | 0V | 0V | VCGR | VCGR-pass | 0V | VCGINH/0V | 0V | VCGINH/0V |

ERASE:

VEGE ~11.5-13V

PROGRAM:

VWLP ~1-2V
VEGP ~3-8V
VBLP ~4.5V
IPROG ~1-2uA
VCGP ~10.5V
VCGP-pass ~3-4V
VBLINH ~2.5V
VCGINH ~3-6V

READ:

VWLR ~1-4V
VEGR ~2-4V
VBLR ~0.5-2V
VCGR ~2.5-4V
VCGR-pass ~3-4V

FIG. 30

| | EG0 | EG1 | EGN | WL0 | WLB | WL1 | BL0 | BL1 | BL2 | BL3 | BLN | CG0_A | CG0_B | CG1_A | CG1_B | CGN_A | CGN_B |
|---|---|---|---|---|---|---|---|---|---|---|---|---|---|---|---|---|---|
| ERASE | VEGE | 0V | 0V | 0V | 0V | 0V | 0V | 0V | 0V | 0V | 0V | VEGE | VEGE | VEGE | VEGE | VEGE | VEGE |
| PROGRAM | VEGP | 0V | 0V | VWLP/VBLINH | 0V | 0V | 0V/VBLR | IPROG | VBLP | VBLINH/FLT 0V/ VBLINH/FLT 0V | 0V | VEGP | VEGP-pass | VEGINH/0V | VEGINH/0V | VEGINH/0V | VEGINH/0V |
| READ | VEGR | 0V | 0V | VWLR | 0V | 0V | 0V/VBLR | VBLR | VBLR/0V | 0V | 0V | VCGR | VCGR-pass | 0V | 0V | 0V | 0V |

ERASE:
VEGE  ~7-9V

VCGE  ~7 to -8V

PROGRAM:
VWLP      ~1-2V
VEGP      ~3-8V
VBLP      ~4.5V
IPROG     ~1-2uA
VCGP      ~10.5V
VCGP-pass ~3-4V
VBLINH    ~2.5V
VCGINH    ~3-6V READ:
VWLR      ~1-4V
VEGR      ~2-4V
VBLR      ~0.5-2V
VCGR      ~2.5-4V
VCGR-pass ~3-4V

FIG. 31

| | WL | WL-unsel | BL | BL-unsel | CG | CG-unsel same select | CG-unsel | EG | EG-unsel | SL | SL-unsel |
|---|---|---|---|---|---|---|---|---|---|---|---|
| Read | 1.0-2V | 0V | 0.6-2V | 0V | 0-2.8V | 0-2.8V | 0-2.8V | 0-2.6V | 0-2.6V | 0V | 0V |
| Erase | 0V | 0V | 0V | 0V | 0V | 0-2.8V | 0-2.8V | 11.5-12V | 0-2.6V | 0V | 0V |
| Program | 1V | 0V | 1uA | Vinh | 10-11V | 0-2.5V | 0-2.6V | 4.5-5V | 0-2.6V | 4.5-5V | 0-1V |

FIG. 34 (PRIOR ART)

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 11.5-12V | 0-2.6V | 0V | 0V |
| Program | 1V | -0.5V/0V | 1uA | Vinh | 10-11V | 0-2.6V | 0-2.6V | 4.5-5V | 0-2.6V | 4.5-5V | 0-1V |

FIG. 35 (PRIOR ART)

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V | 0V | 0-2.6V | 0-2.6V | 0-2.6V | 0-2.6V | 0-2.6V | 0V | 0V |
| Erase | 0V | -0.5V/0V | 0V | 0V | -(5-9)V | 0-2.6V | 0-2.6V | 8-9V | 0-2.6V | 0V | 0V |
| Program | 1V | -0.5V/0V | 1uA | Vinh | 8-9V | CGINH (4-6V) | 0-2.6V | 8-9V | 0-2.6V | 4.5-5V | 0-1V |

FIG. 36 (PRIOR ART)

METHOD AND APPARATUS FOR INHIBITING THE PROGRAMMING OF UNSELECTED BITLINES IN A FLASH MEMORY SYSTEM

RELATED APPLICATIONS

This application claims the benefit of U.S. Provisional Application No. 62/141,082, filed Mar. 31, 2015 and titled "METHOD AND APPARATUS FOR INHIBITING THE PROGRAMMING OF UNSELECTED BITLINES IN A FLASH MEMORY SYSTEM," which is incorporated herein by reference.

FIELD OF THE INVENTION

The present invention relates to non-volatile memory arrays.

BACKGROUND OF THE INVENTION

Split gate non-volatile flash memory cells are well known. An exemplary non-volatile split gate memory cell is shown in FIG. 33. The memory cell comprises a semiconductor substrate 10 of a first conductivity type, such as P type. The substrate has a surface on which there is formed a first region 17 (also known as the source line SL) of a second conductivity type, such as N type. A second region 18 (also known as the drain line) also of N type is formed on the surface of the substrate. Between the first region and the second region is a channel region 22. A bit line BL 20 is connected to the second region 18. A word line WL 26 is positioned above a first portion of the channel region 22 and is insulated therefrom. The word line 26 has little or no overlap with the second region 18. A floating gate FG 12 is over another portion of the channel region 22. The floating gate 12 is insulated therefrom, and is adjacent to the word line 26. The floating gate 12 is also adjacent to the first region 17. The floating gate 12 may overlap the first region 17 to provide coupling from the region into the floating gate 12. A coupling gate CG 14 (also known as control gate) is over the floating gate 12 and is insulated therefrom. An erase gate EG 16 is over the first region 17 and is adjacent to the floating gate 12 and the coupling gate 14 and is insulated therefrom. The top corner of the floating gate 12 may point toward the inside corner of the T-shaped erase gate 16 to enhance erase efficiency. The erase gate 16 is also insulated from the first region 17. The cell is more particularly described in U.S. Pat. No. 7,868,375 whose disclosure is incorporated herein by reference in its entirety.

One exemplary operation for erase and program of the non-volatile memory cell is as follows. The cell is erased, through a Fowler-Nordheim tunneling mechanism, by applying a high voltage on the erase gate 16 with other terminals equal to zero volt. Electrons tunnel from the floating gate 12 into the erase gate 16 causing the floating gate 12 to be positively charged, turning on the cell in a read condition. The resulting cell erased state is known as '1' state. The cell is programmed, through a source side hot electron programming mechanism, by applying a high voltage on the coupling gate 14, a high voltage on the source line 17, a medium voltage on the erase gate 16, and a programming current on the bit line 20. A portion of electrons flowing across the gap between the word line 26 and the floating gate 12 acquire enough energy to inject into the floating gate 12 causing the floating gate 12 to be negatively charged, turning off the cell in read condition. The resulting cell programmed state is known as '0' state.

One set of exemplary operating parameters for the memory cell of FIG. 33 is shown in FIG. 34.

Another set of exemplary operating parameters for the memory cell of FIG. 33 is shown in FIG. 35.

Another set of exemplary operating parameters for the memory cell of FIG. 33 is shown in FIG. 36.

An exemplary layout for a flash memory system comprising memory cells of the type shown in FIG. 33 is shown in FIG. 37.

In prior art systems, memory cells typically are formed in pairs that share certain components. For example, U.S. Pat. No. 6,747,310 discloses such memory cells having source and drain regions defining a channel region there between, a select gate over one portion of the channel regions, a floating gate over the other portion of the channel region, and an erase gate over the source region. The memory cells are formed in pairs that share a common source region and common erase gate, with each memory cell having its own channel region in the substrate extending between the source and drain regions (i.e. there are two separate channel regions for each pair of memory cells). The lines connecting all the control gates for memory cells in a given column run vertically. The same is true for the lines connecting the erase gates and the select gates, and the source lines. The bit lines connecting drain regions for each row of memory cells run horizontally.

FIG. 1 illustrates a first such memory cell design (CELL #1), where each memory cell includes a floating gate 12 (FG) disposed over and insulated from the substrate 10, a control gate 14 (CG) disposed over and insulated from the floating gate 12, an erase gate 16 (EG) disposed adjacent to and insulated from the floating and control gates 12/14 and disposed over and insulated from the substrate 10, where the erase gate is created with a T shape such that a top corner of the control gate CG faces the inside corner of the T shaped erase gate to improve erase efficiency, and a drain region 18 (DR) in the substrate adjacent the floating gate 12 (with a bit line contact 20 (BL) connected to the drain diffusion regions 18 (DR)). The memory cells are formed as pairs of memory cells (A on the left and B on the right), sharing a common erase gate 16. This cell design differs from that in the '310 patent discussed above at least in that it lacks a source region under the erase gate EG, lacks a select gate (also referred to as a word line), and lacks a channel region for each memory cell. Instead, a single continuous channel region 22 extends under both memory cells (i.e. extends from the drain region 18 of one memory cell to the drain region 18 of the other memory cell). To read or program one memory cell, the control gate 14 of the other memory cell is raised to a sufficient voltage to turn on the underlying channel region portion via voltage coupling to the floating gate 12 there between (e.g. to read or program cell A, the voltage on FGB is raised via voltage coupling from CGB to turn on the channel region portion under FGB).

FIG. 2 illustrates a second such memory cell design (CELL #2), which is the same as CELL #1 except there are no bit line contacts 20 in electrical contact with the drain regions 18 (DR), and instead there is an erase gate line 24 (EGL) that connects together all the erase gates 16 (EG) in the row of memory cells.

FIG. 3 illustrates a third such memory cell design (CELL #3), where each memory cell includes a floating gate 12 (FG) disposed over and insulated from the substrate and a control gate 14 (CG) disposed over and insulated from the floating gate 12. To one side of the floating and control gates 12/14 is a word line (select) gate 26 (WL), and to the other side of the floating and control gates 12/14 is an erase gate 16 (EG). A drain region 18 (DR) is disposed in the substrate 10 underneath the erase gate 16 (EG). The memory cells are formed as pairs of memory cells sharing a common word line gate 26, and with a single continuous channel region 22 extending under both memory cells (i.e. extends from the drain region 18 of one memory cell to the drain region 18 of the other memory cell 18). As with Cells #1 and #2, to read or program one memory cell, the control gate 14 of the other memory cell is raised to a sufficient voltage to turn on the underlying channel region portion via voltage coupling to the floating gate 12 there between.

Due to the close proximity of components in CELLS #1, #2, and #3, one drawback is that programming errors often occur. For example, when a programming current is applied to a first bitline to program a selected memory cell coupled to that first bitline, a cell attached to the second bitline might inadvertently be programmed as well. What is needed is a mechanism for inhibiting the programming of cells attached to all bitlines except for the bitline attached to the selected cell.

BRIEF SUMMARY OF THE INVENTION

The aforementioned problems and needs are addressed by a various circuit embodiments for inhibiting the programming of cells attached to unselected bit lines. Other objects and features of the present invention will become apparent by a review of the specification, claims and appended figures.

BRIEF DESCRIPTION OF THE DRAWINGS

FIGS. 8 and 9 are tables of operating voltages for architecture #1.

FIGS. 12 and 13 are tables of operating voltages for architecture #2.

FIGS. 17 and 18 are tables of operating voltages for architecture #3.

FIGS. 21 and 22 are tables of operating voltages for architecture #4.

FIGS. 26 and 27 are tables of operating voltages for architecture #5.

FIGS. 30 and 31 are tables of operating voltages for architecture #6.

FIG. 34 depicts exemplary prior art operating parameters for the memory cell of FIG. 33.

FIG. 35 depicts exemplary prior art operating parameters for the memory cell of FIG. 33.

FIG. 36 depicts exemplary prior art operating parameters for the memory cell of FIG. 33.

DETAILED DESCRIPTION OF THE INVENTION

Improved architectures for memory cell layout are first described.

Architecture #1

Figure 1:
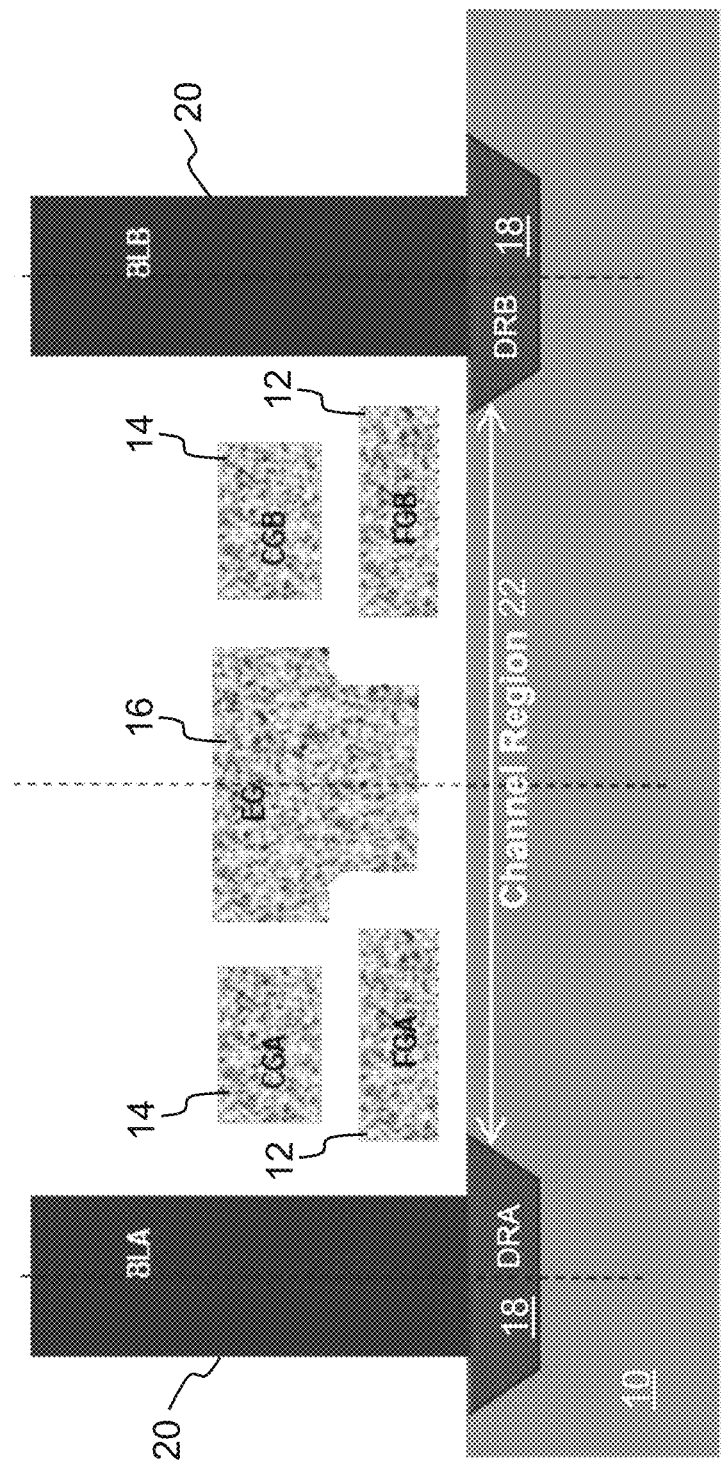
FIG. 1 is a side cross section view of a first memory cell design (CELL #1).
Figure 2:
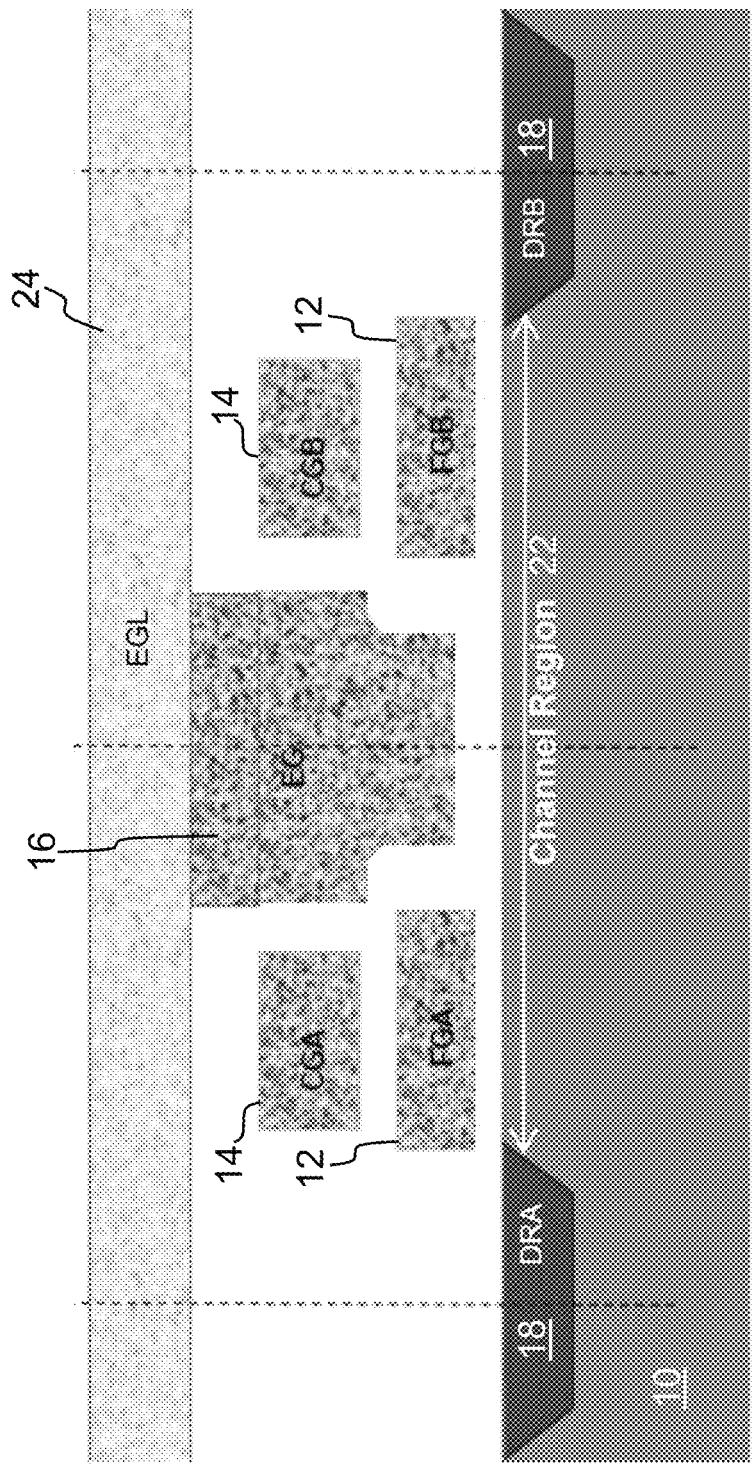
FIG. 2 is a side cross section view of a second memory cell design (CELL #2).
Figure 3:
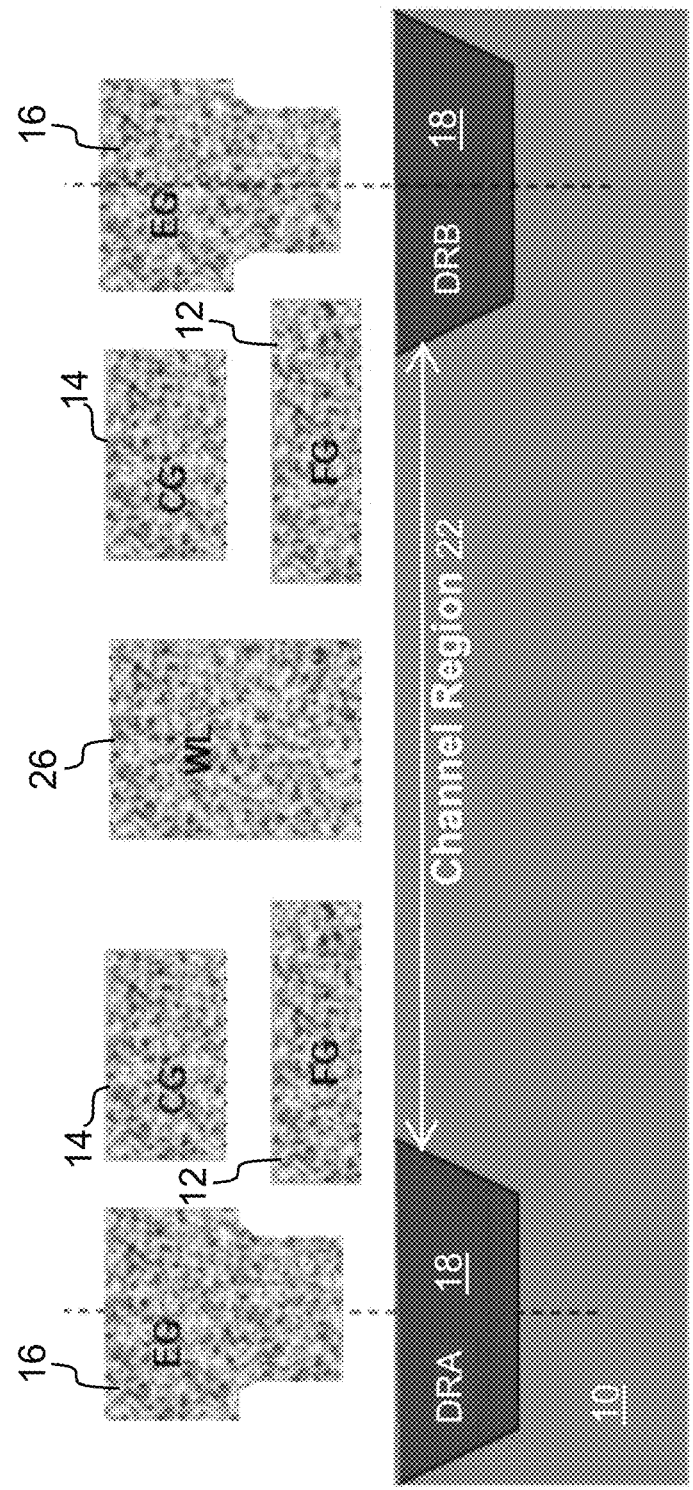
FIG. 3 is a side cross section view of a third memory cell design (CELL #3).
Figure 4:
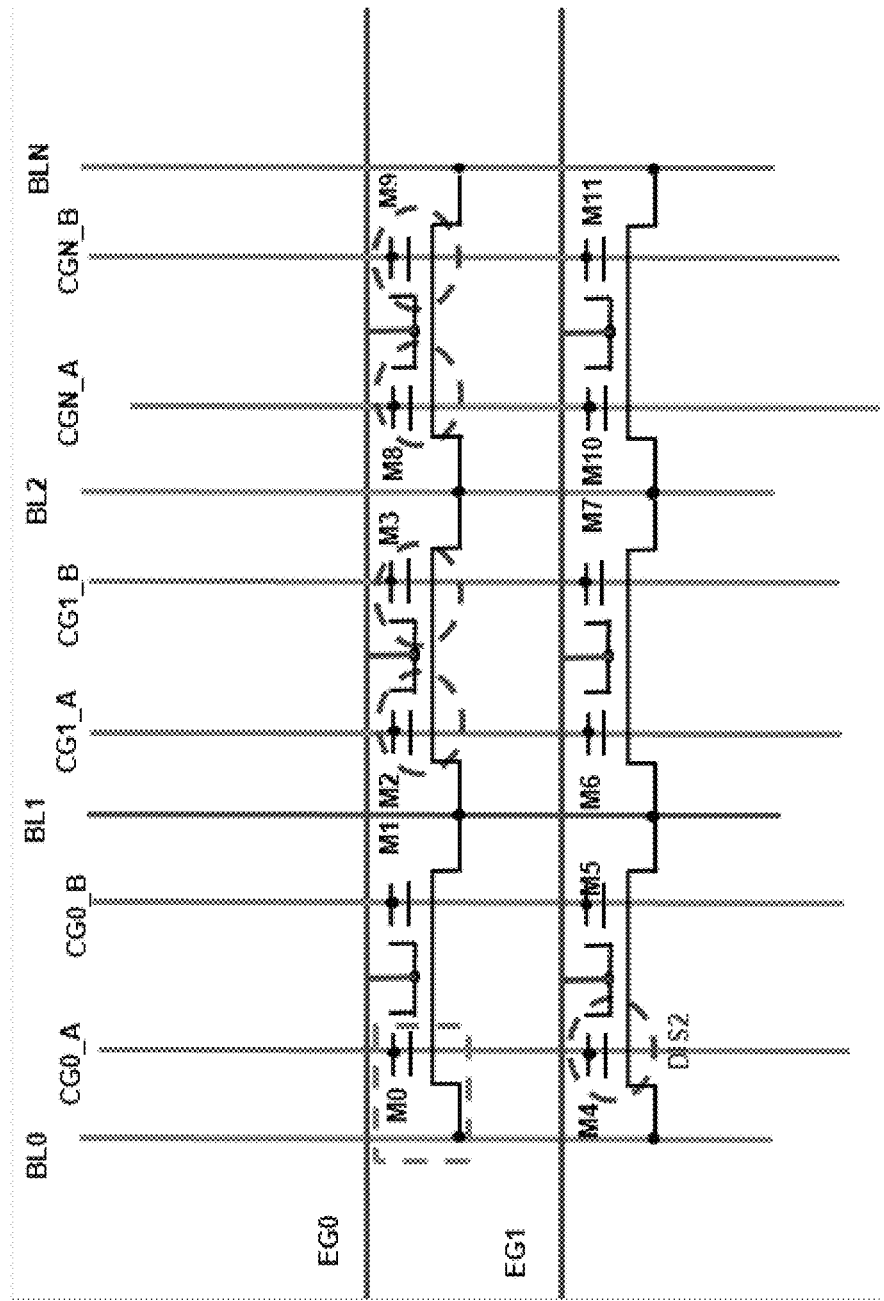
FIG. 4 is a schematic diagram of a first memory cell array architecture (architecture #1), applicable for Cell #2.
Figure 5:
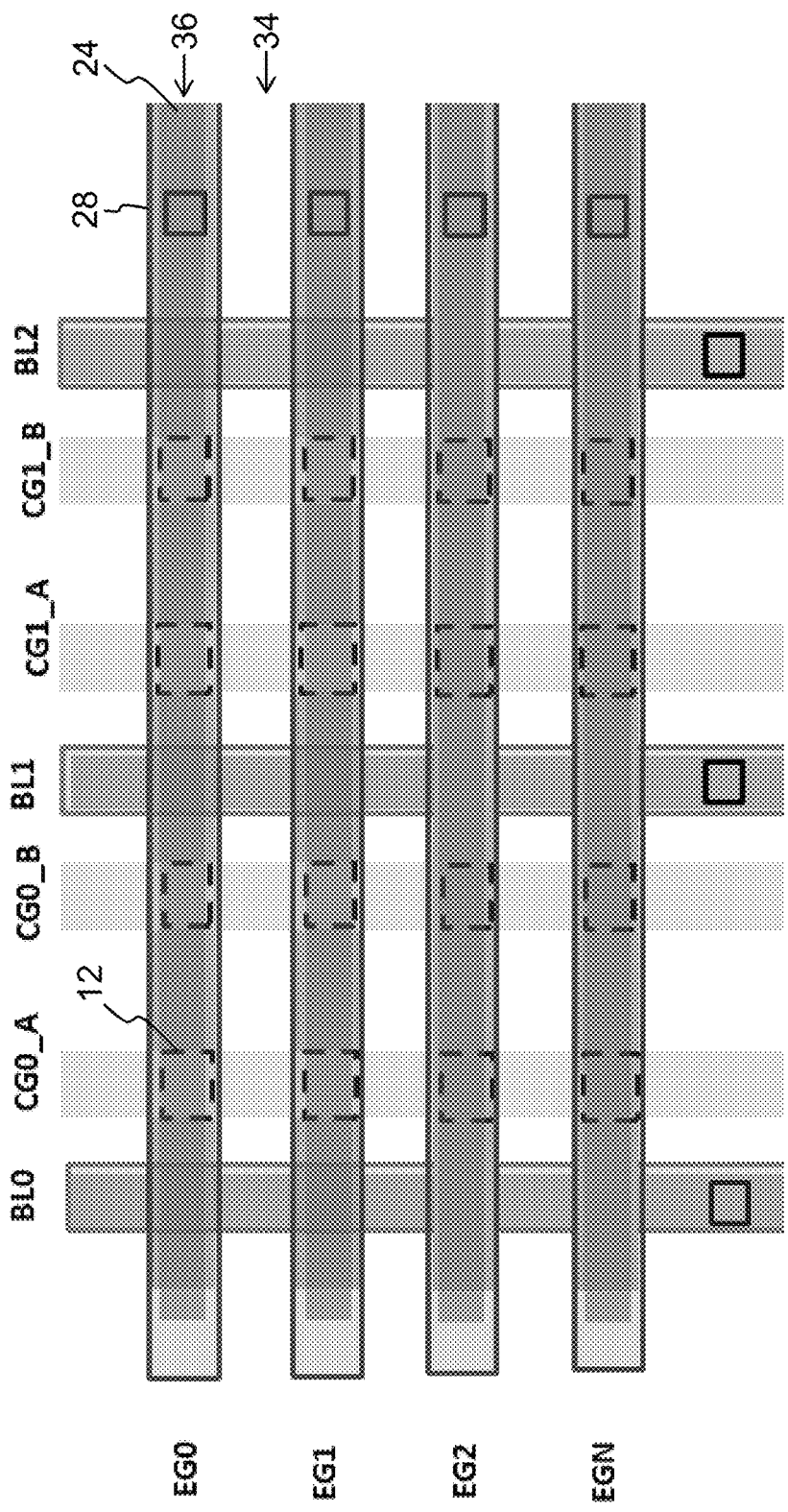
FIG. 5 is a plan view of the memory cell array layout for architecture #1.

FIG. 4 shows a first architecture (#1), and FIG. 5 shows the corresponding memory cell array layout, which are applicable to Cell #2. The memory cell pairs, and the active regions 36 in which they are formed, extend horizontally, and are interlaced between horizontally extending isolation regions 34 (e.g., STI insulation material formed in the substrate). The bit lines BL0, BL1, etc. are lines of conductive diffusion in the substrate 10 running along the columns of memory cells (i.e., for each column, the drain regions 18 and the diffusion extending there between in the column direction form a conductive bit line that electrically connecting the column of drain regions to each other). The erase gate lines EG0, EG1, etc. are preferably stripes of conductive polysilicon 24 each forming the erase gates 16 (EG) for that row of memory cells, and each strapped to (i.e., repeatedly connected to) a metal line 28 running over the polysilicon stripe (in the horizontal direction). The control gate lines CG0, CG1, etc. are preferably stripes of conductive polysilicon each forming the control gates 14 (CG) for that column of memory cells, and each can be strapped to a metal line running over the polysilicon stripe (in the vertical direction) (i.e., each control gate line can be the control gates 14 and the polysilicon connecting them, and/or a metal line strapped to the control gate polysilicon).

In this embodiment, the pairs of memory cells are configured in an array such that for each of the pairs of memory cells, the channel region extends from the first drain region DRA to the second drain region DRB in the same direction (horizontally to the right in FIG. 5). Additionally, in each active region, the pairs of memory cells are configured end to end such that the first region of one memory cell pair is contiguously formed with (electrically connected to) the second region of an adjacent memory cell pair in the same active region, and the second region of the one memory cell pair is continuously formed with (electrically connected to) the first region of the other adjacent memory cell pair in the same active region.

Figure 6:
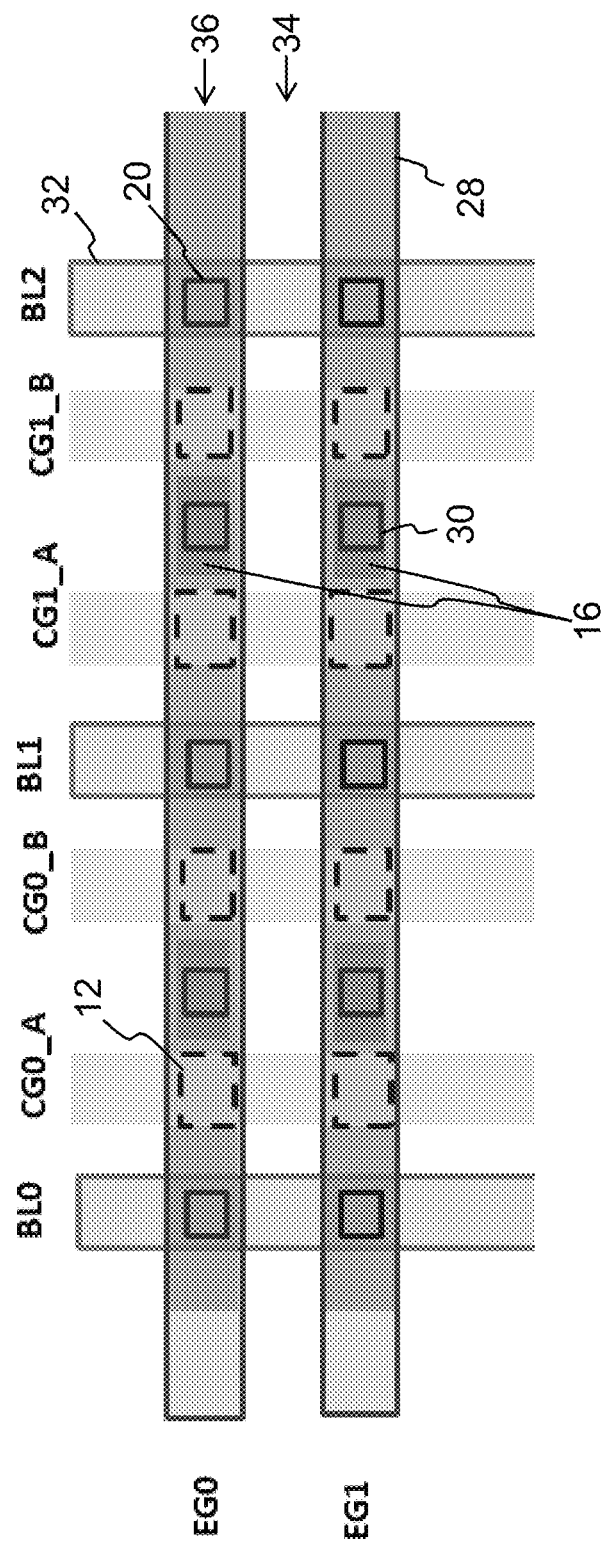
FIG. 6 is a plan view of a first alternate memory cell array layout for architecture #1.

FIG. 6 shows first alternate layout for the first architecture (#1), which is applicable for Cells #1 and #2. This layout is the same as in FIG. 5, except that the erase gates 16 (EG) are formed as individual poly blocks, and connected to a metal strap line 28 (extending in the horizontal direction) by vertical contacts 30. Additionally, metal bit lines 32 extending in the vertical direction connect to the drain diffusion via contacts 20 for each memory cell.

Figure 7:
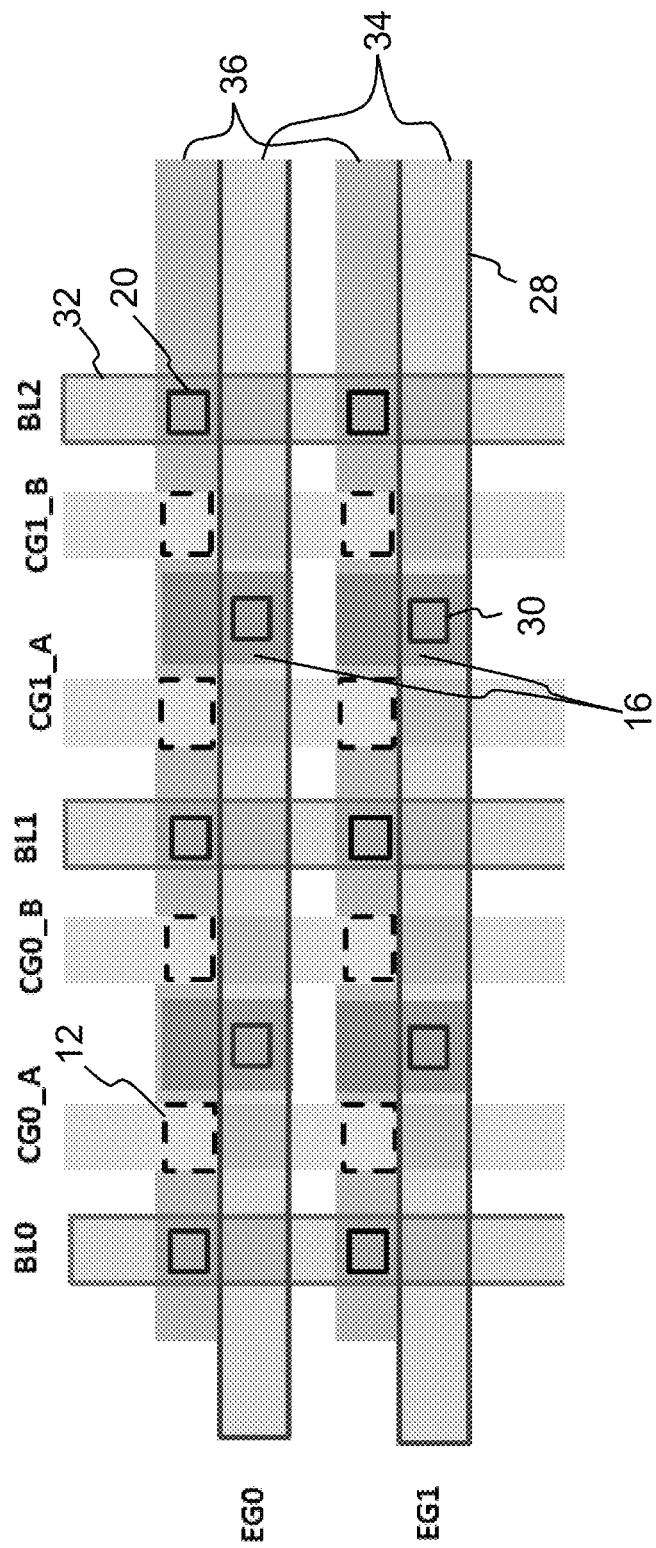
FIG. 7 is a plan view of a second alternate memory cell array layout for architecture #1.

FIG. 7 shows a second alternate layout for the first architecture (#1), which is applicable for Cells #1 and #2. This layout is the same as in FIG. 6, except that the erase gate blocks 16 extend from the active regions 36 into the STI isolation regions 34, and the metal EG lines 28 and the contacts therefrom 30 to the erase gate blocks 16 are disposed in the isolation region 34 (which better protects the oxide under the erase gates 16).

FIG. 8 includes a table of operating voltages (including non-limiting examples of actual voltages) for programming and reading a selected memory cell (in this case memory cell M0, which corresponds to EG0, BL0 and CG0_A) for architecture #1. The erase voltage (VEGE on the selected EG line) indicated in this figure will erase all the memory cells in the pair of rows containing the selected memory cell M0. FIG. 9 includes a second table of operating voltages which is the same as in FIG. 8, except a lower erase voltage VEGE is used, and a negative voltage VCGE is applied to the control gates during erase. In a read operation, selected BL, EG and CG lines of a selected memory cell pair (connecting to BL, EG, and CG of a selected memory cell within a selected memory cell pair) are biased at selected read bias voltages, the other CG line of the selected memory pair (connecting to other CG of unselected memory cell of selected memory cell pair) is biased at a pass read bias voltage, while other unselected CG lines are biased at 0 volts, and other BL lines are biased at 0 Volts. In a program operation, selected BL, EG and CG of the selected memory cell pair are biased at selected program bias voltages, the other BL of the selected memory cell pair is biased at a program current, the other CG line of selected memory cell pair is biased at a pass program bias voltage, and adjacent CG lines of next adjacent memory cell pairs abutting the selected memory cell pair are biased at an inhibit program bias, and other unselected CG lines are biased at 0 volts.

Architecture #2

Figure 10:
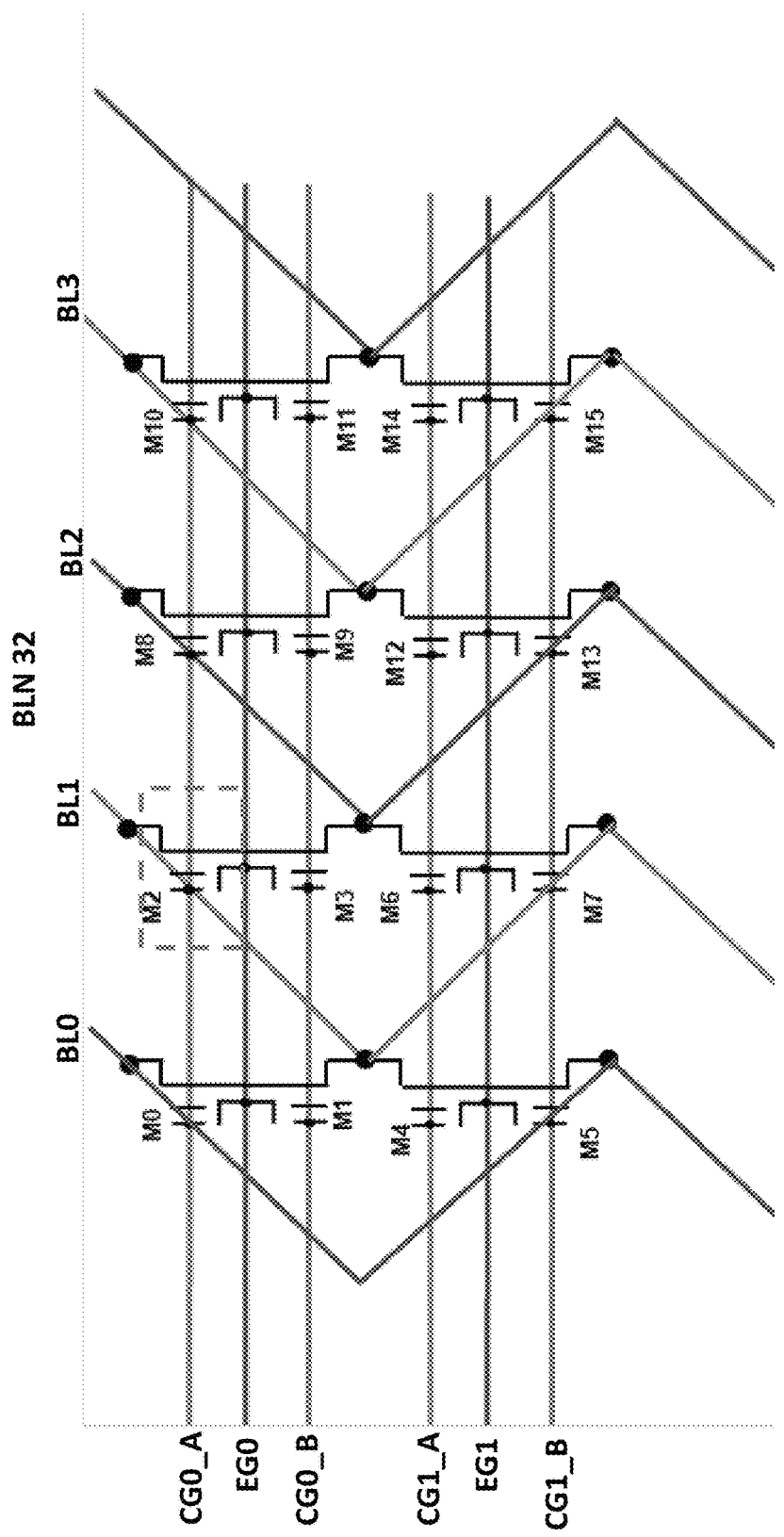
FIG. 10 is a schematic diagram of a second memory cell array architecture (architecture #2), applicable for Cells #1 and #2.
Figure 11:
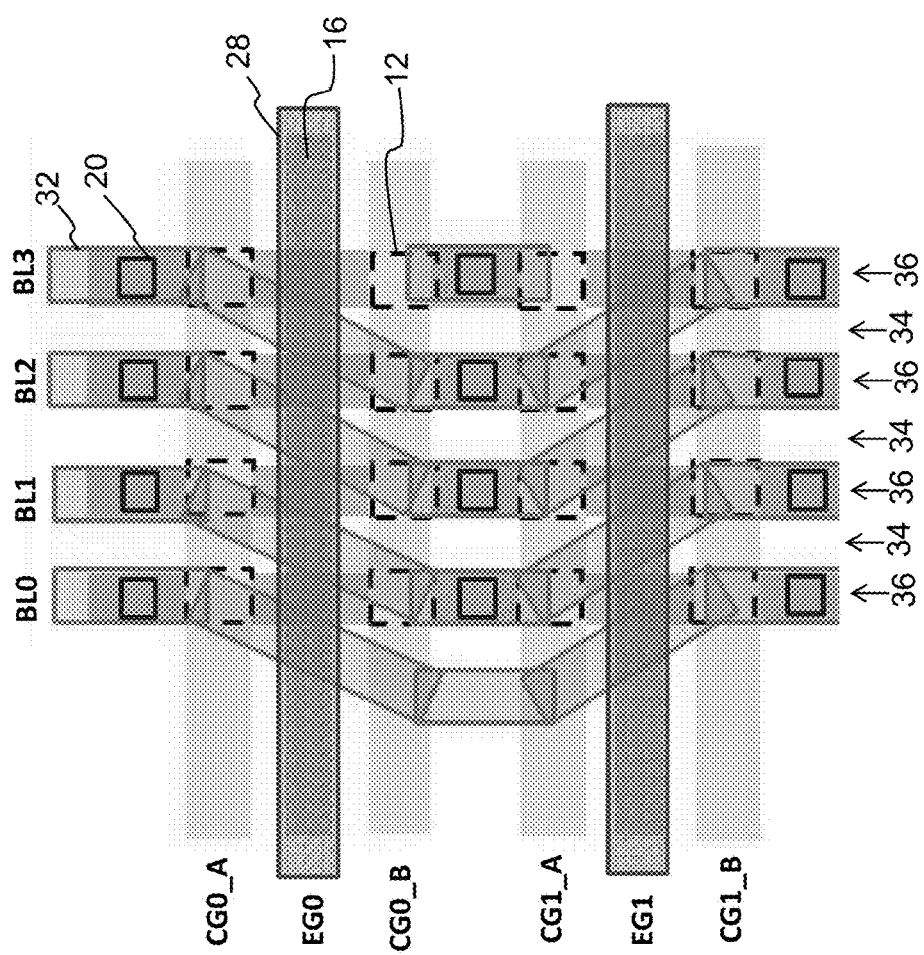
FIG. 11 is a plan view of the memory cell array layout for architecture #2.

FIG. 10 shows a second architecture (#2), and FIG. 11 shows the corresponding layout, which is applicable for Cells #1 and #2. In this configuration, the pairs of memory cells are oriented orthogonally relative to architecture #1 (i.e. with architecture #2, each pair of memory cells sharing a common erase gate 16 (EG) extends in the vertical direction as do the active and isolation regions 36/34, meaning one memory cell of the pair of memory cells sharing an erase gate is above the other in the column). This also means the control gate lines 14 (CG0, CG1, etc.) run horizontally instead of vertically. The bit lines 32 (BL) remain running generally vertically (along the length of the columns). However, purely vertical bit lines 32 (BL) are not compatible with the virtual ground memory cell configuration because of the need to independently operate (i.e. at different voltages) the two drain regions 18 for each memory cell pair. Therefore, the bit lines 32 (BL0, BL1, BL2, etc.) (i.e., conductive lines such as metal connected to the individual drain regions by contacts 20), are in a zigzag configuration, where they connect to two adjacent columns of the memory cells in an alternating fashion. Specifically, for any given memory cell pair sharing a common erase gate 16, two different bit lines 32 connect to the two drain regions 18 respectively. As shown in FIGS. 10 and 11, each bit line 32 connects to the drain 18 of one of the memory cell pair, then moves over laterally and connects to the other drain region 18 but in a different column, and then the reverse for the next pair of memory cells, and so on. Therefore, the two drain regions 18 for each pair of memory cells (sharing a common erase gate 16) are connected to two different bit lines 32. Preferably the erase gates 16 for each row of memory cells are a continuous polysilicon stripe strapped to a horizontal metal line 28. Similarly, the control gates 14 for each row of memory cells are a continuous horizontal poly, which can also be strapped to a horizontal metal line.

In this embodiment, the pairs of memory cells are configured in an array such that for each of the pairs of memory cells, the channel region extends from the first drain region DRA to the second drain region DRB in the same direction (vertically down in FIG. 11). Additionally, in each active region, the pairs of memory cells are configured end to end such that the first region of one memory cell pair is contiguously formed with (electrically connected to) the second region of an adjacent memory cell pair in the same active region, and the second region of the one memory cell pair is continuously formed with (electrically connected to) the first region of the other adjacent memory cell pair in the same active region.

FIG. 12 includes a table of operating voltages (including non-limiting examples of actual voltages) for programming and reading a selected memory cell (in this case memory cell M2, which corresponds to EG0, BL1 and CG0_A) for architecture #2. The erase voltage (VEGE on the selected EG line) indicated in this figure will erase all the memory cells in the pair of rows containing the selected memory cell M2. FIG. 13 includes a second table of operating voltages which is the same as in FIG. 12, except a lower erase voltage VEGE is used, and a negative voltage VCGE is applied to the control gates during erase. In a read operation, selected BL, EG and CG lines of a selected memory cell pair are biased at selected read bias voltages, the other CG of selected memory cell pair is biased at a pass read bias voltage, while other unselected CGs are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, while the other adjacent BL line of unselected memory cell pair sharing the selected BL and CG lines is biased at an inhibit voltage VBLINH, and other unselected BL lines are biased at an inhibit voltage VBLINH (or float or 0 Volt), while the other CG line of selected memory cell pair is biased at a pass program bias voltage and other unselected CGs are biased at 0 volts.

Architecture #3

Figure 14:
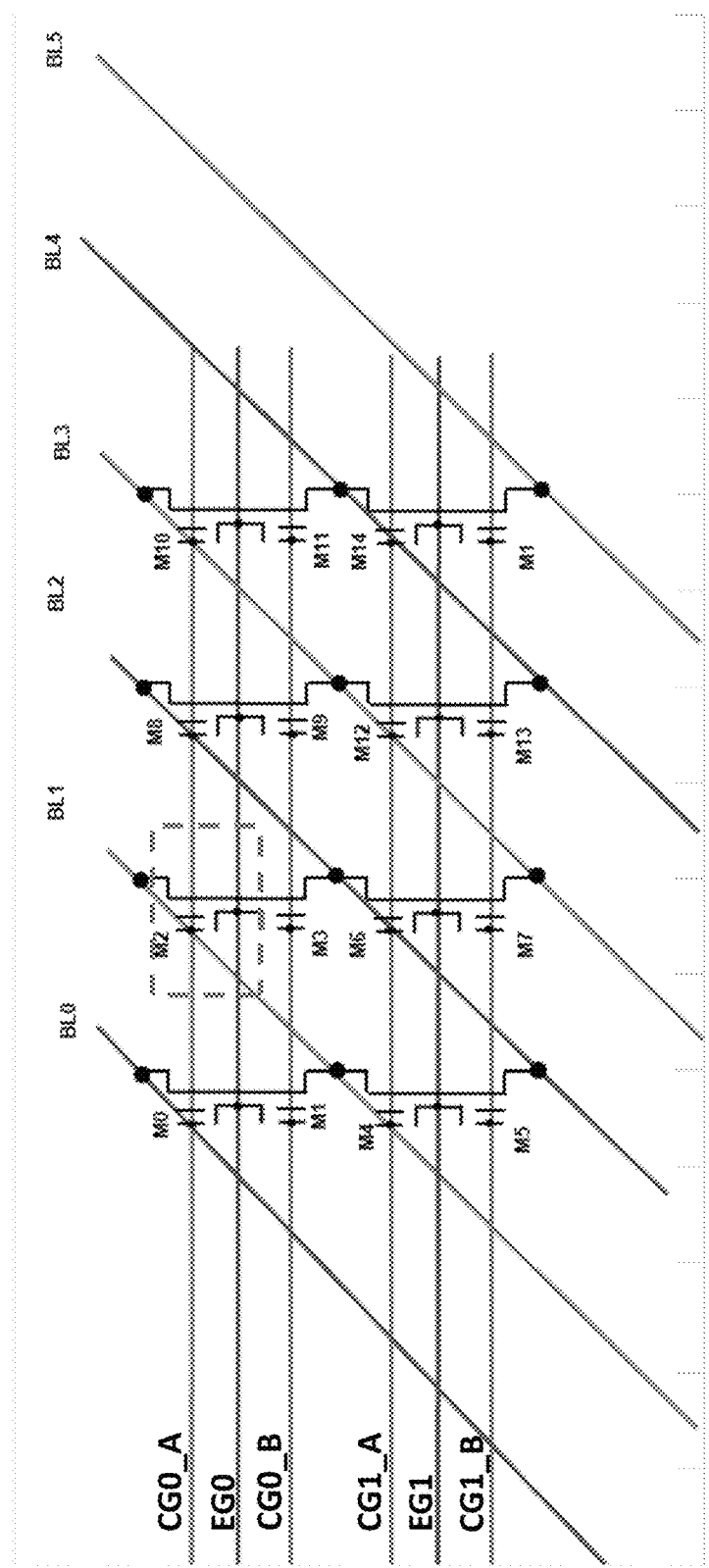
FIG. 14 is a schematic diagram of a third memory cell array architecture (architecture #3), applicable for Cells #1 and #2.
Figure 15:
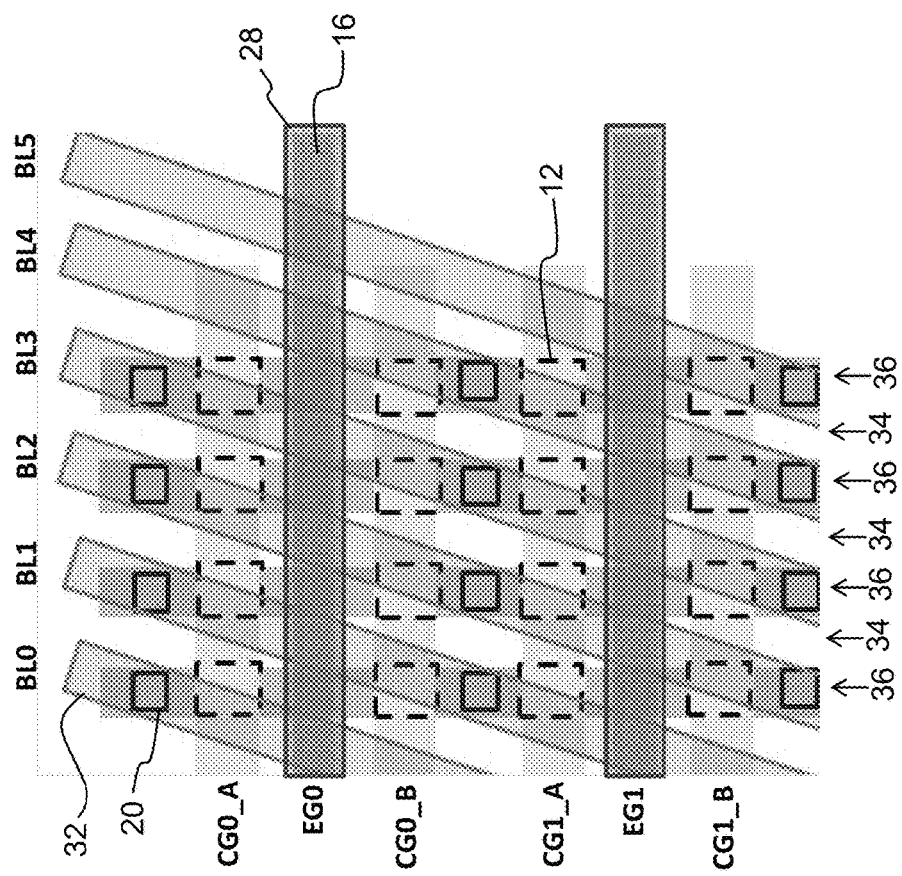
FIG. 15 is a plan view of the memory cell array layout for architecture #3.

FIG. 14 shows a third architecture (#3), and FIG. 15 shows the corresponding layout, which is applicable for Cells #1 and #2. This configuration is similar to that of the second architecture #2, but the bit lines 32 (BL) are arranged in a diagonal configuration (relative to the direction of the active regions) instead of a zigzag configuration, so that each successive drain connection is in an adjacent column. Specifically, each bit line 32 (BL) connects to one drain region 18 (DR) in one column and then connects to the next drain region 18 (DR) but in the next column over, and so on. For example, bit line BL3 connects to left hand drain for memory pair 0 in column 3, and then connects to right hand drain for memory pair 0 but in column 2, and then connects to the left hand drain for memory pair 1 in column 1, and so on. Therefore, the two drain regions 18 for each pair of memory cells (sharing a common erase gate 16) are connected to two different bit lines 32. Preferably the erase gates 16 are a continuous polysilicon stripe strapped to a horizontal metal line 28. Similarly, the control gates are a continuous horizontal poly for each row of memory cells, and can be strapped to a horizontal metal line.

Figure 16:
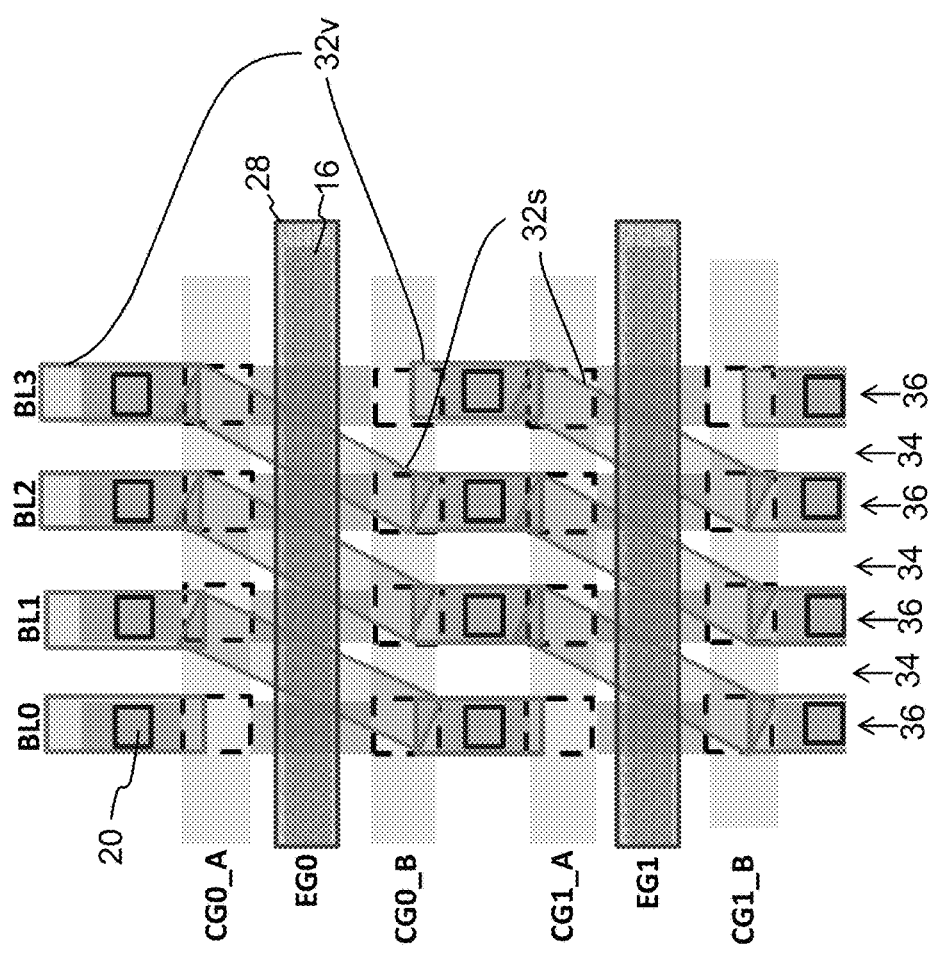
FIG. 16 is a plan view of a first alternate memory cell array layout for architecture #3.

FIG. 16 below shows an alternate layout for architecture #3. This layout is the same as that in FIG. 16, except that instead of the bit lines 32 (BL) having a linear slant, they have vertical portions 32v over the contacts (extending in the column direction), and slant portions 32s (extending at a non-zero angle relative to the column direction) making the connection with the next adjacent column.

FIG. 17 includes a table of operating voltages (including non-limiting examples of actual voltages) for programming and reading a selected memory cell (in this case memory cell M2, which corresponds to EG0, BL1 and CG0_A) for architecture #3. The erase voltage (VEGE on the selected EG line) indicated in this figure will erase all the memory cells in the pair of rows containing the selected memory cell M2. FIG. 18 includes a second table of operating voltages which is the same as in FIG. 17, except a lower erase voltage VEGE is used, and a negative voltage VCGE is applied to the control gates during erase. In a read operation, selected BL, EG and CG lines of a selected memory cell pair are biased at selected read bias voltages, the other CG line of selected memory cell pair is biased at a pass read bias voltage, other unselected CGs are biased at 0 Volts, and other BL lines are biased at 0 Volts. In a program operation, selected BL, EG and CG lines of the selected memory cell pair are biased at a selected program bias voltages, the other BL line of the selected memory cell pair is biased at a program current, other adjacent BL line of unselected memory cell pairs sharing the selected BL and CG lines is biased at an inhibit voltage VBLINH, other unselected BLs are biased at an inhibit voltage VBLINH (or float or 0 Volt), the other CG of selected memory cell pair is biased at a pass program bias voltage, and other unselected CGs are biased at 0 volt.

Architecture #4

Figure 19:
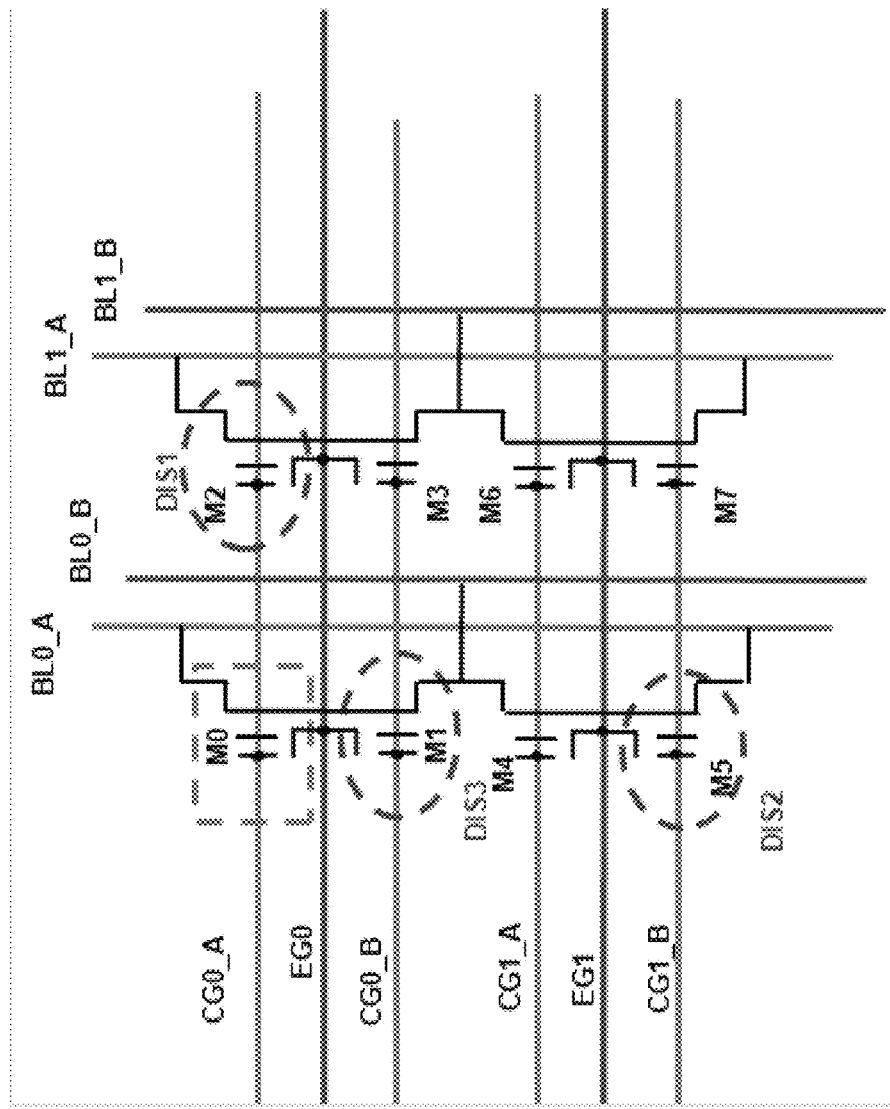
FIG. 19 is a schematic diagram of a fourth memory cell array architecture (architecture #4), applicable for Cells #1 and #2.
Figure 20:
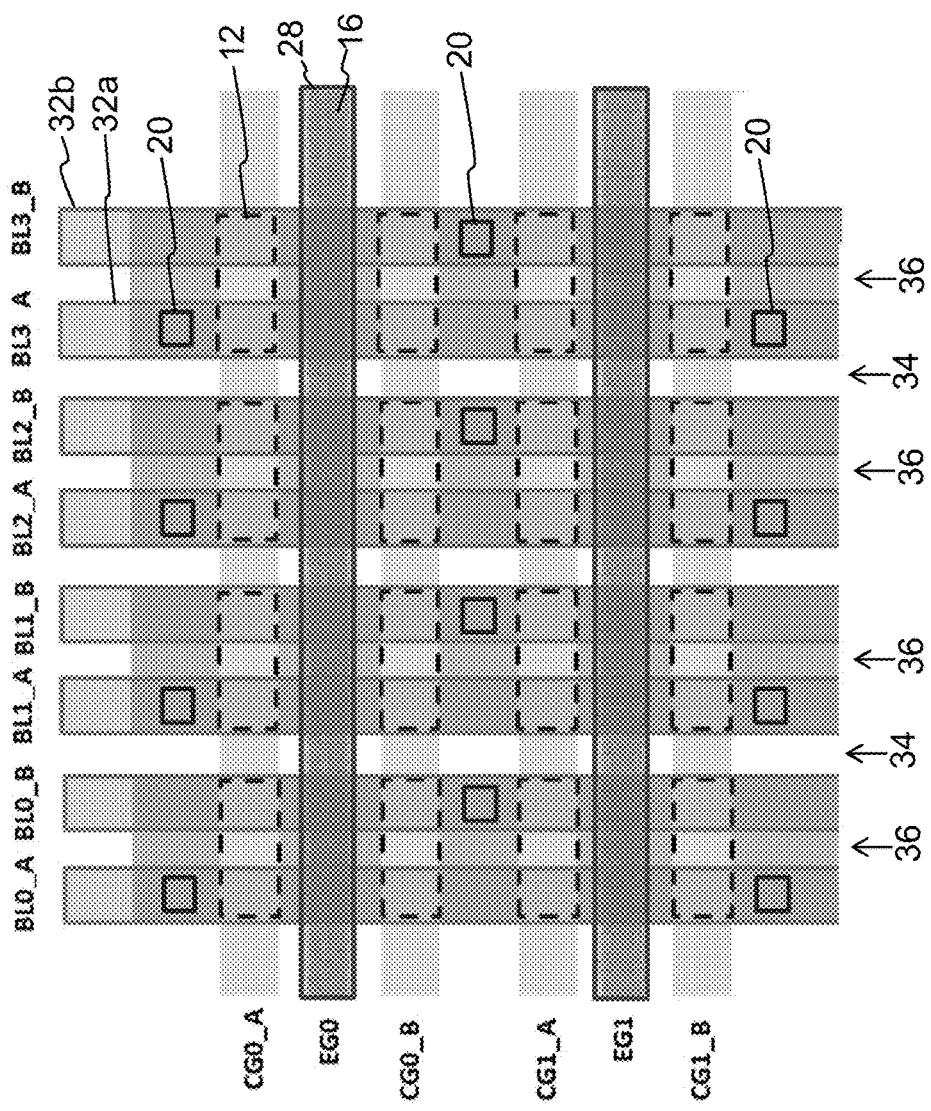
FIG. 20 is a plan view of the memory cell array layout for architecture #4.

FIG. 19 shows a fourth architecture (#4), and FIG. 20 shows the corresponding layout, which is applicable for Cells #1 and #2. This configuration is similar to that of the second and third architectures #2 and #3, but instead of bit lines 32 (BL) arranged with a zigzag, linear diagonal, or vertical with slanted segments (to avoid both drain regions for each pair of memory cells sharing a common erase gate being connected to the same bit line), there are two vertical bit lines 32a and 32b for each column of memory cells, where the contacts 20 from the bit lines 32a and 32b down to the drain regions 18 are staggered. Specifically, for column 3, the first bit line 32a (BL3_A) is connected via contacts 20 to just the right hand drain 18 for each memory pair, and the second bit line 32b (BL3_B) is connected via contacts 20 to just the left hand drain 18 for each memory pair. The drain regions 20 are wide enough in the horizontal direction so that both bit lines 32a and 32b pass vertically over each drain region 18. Therefore, the two drain regions 18 for each pair of memory cells (sharing a common erase gate 16) are connected to two different bit lines 32a/32b.

FIG. 21 includes a table of operating voltages (including non-limiting examples of actual voltages) for programming and reading a selected memory cell (in this case memory cell M0, which corresponds to EG0, BL0_A, and CG0_A) for architecture #4. The erase voltage (VEGE on selected EG line) indicated in this figure will erase all the memory cells in the pair of rows containing the selected memory cell M0. FIG. 22 includes a second table of operating voltages which is the same as in FIG. 21, except a lower erase voltage VEGE is used, and a negative voltage VCGE is applied to the control gates during erase. In a read operation, selected BL, EG and CG lines of a selected cell pair are biased at selected read bias voltages, the other CG line of selected memory cell pair is biased at a pass read bias voltage, other unselected CG lines are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, other unselected BLs are biased at an inhibit voltage VBLINH, the other CG of selected memory cell pair is biased at a pass program bias voltage, and other unselected CGs are biased at 0 volts.

Architecture #5

Figure 23:
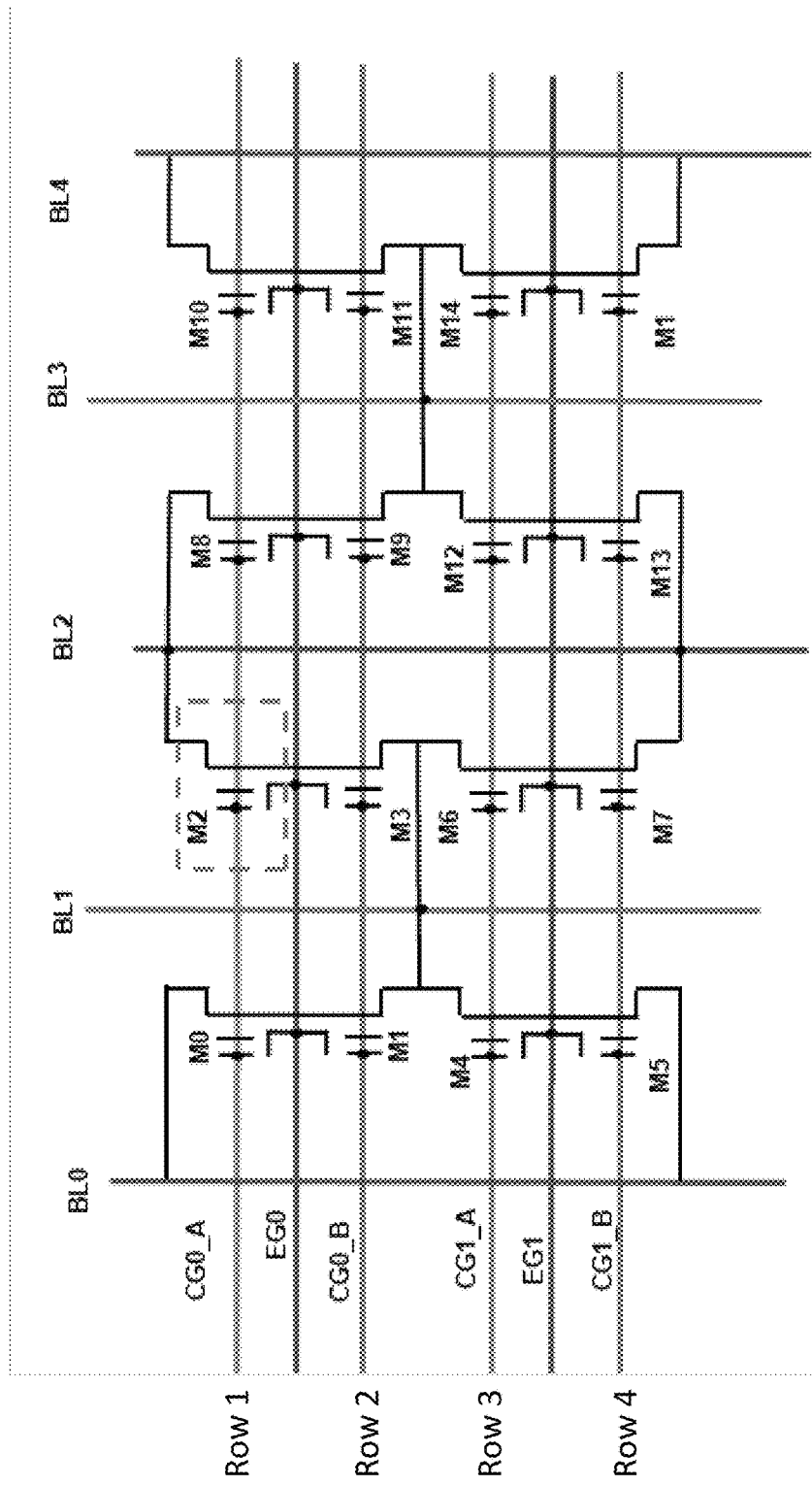
FIG. 23 is a schematic diagram of a fifth memory cell array architecture (architecture #5), applicable for Cell #1.
Figure 24:
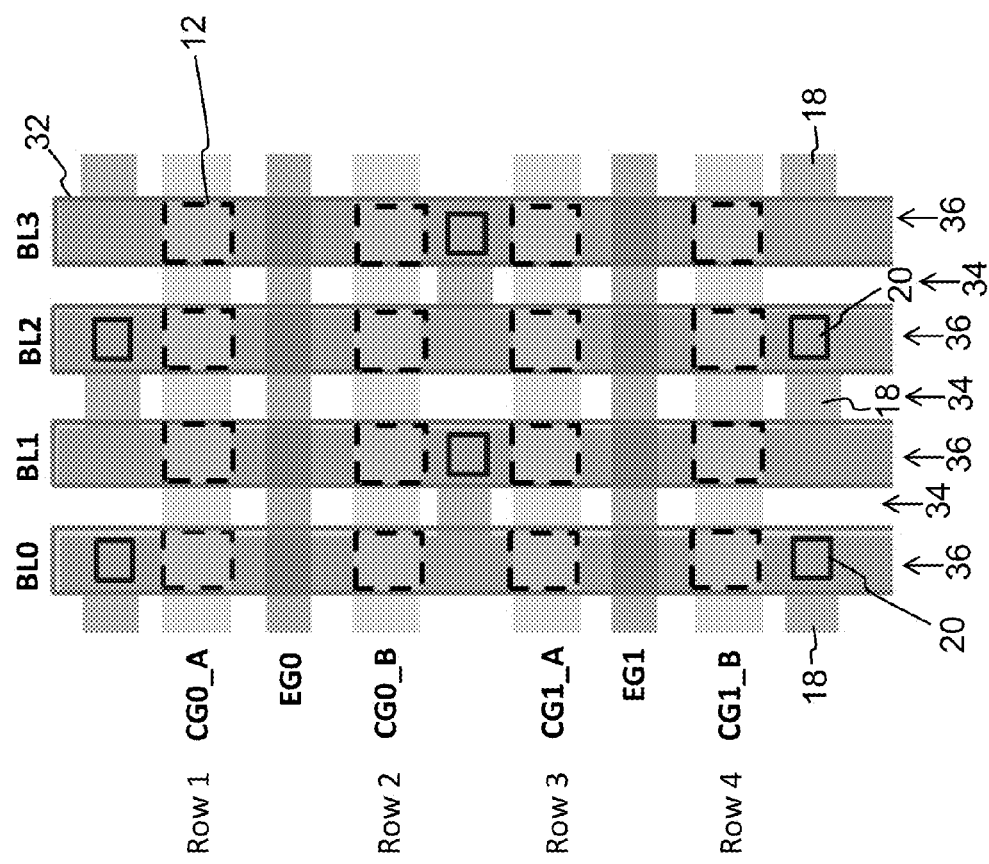
FIG. 24 is a plan view of the memory cell array layout for architecture #5.
Figure 25:
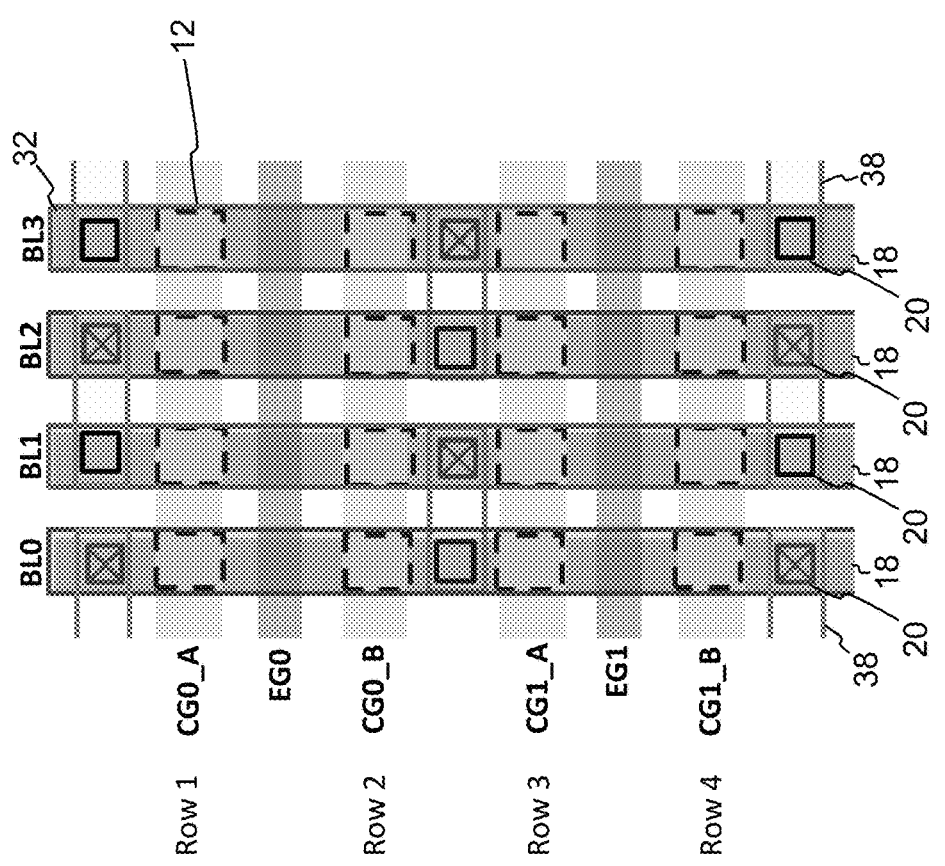
FIG. 25 is a plan view of a first alternate memory cell array layout for architecture #5.

FIG. 23 shows a fifth architecture (#5), and FIGS. 24-25 show the corresponding layouts, which is applicable for Cell #1. In this configuration, instead of the bit lines 32 (BL) arranged with a zigzag, linear diagonal, or vertical with slanted segments, or multiple bit lines per column of memory cells (to avoid both drain regions for each pair of memory cells sharing a common erase gate being connected to the same bit line), there is a single vertical bit line 32 for each column of memory cells, where each bit line 32 is connected only to every other drain region 18 in the column. For example, bit line BL0 is connected to the drain 18 for rows 1, 4-5, 8-9, and so on (given the drain regions 18 are shared between adjacent memory cell pairs). Bit line BL1 is connected to the drain 18 for rows 2-3, 6-7, 10-11, and so on. Any drain 18 having a contact to a bit line 32 is also electrically connected to the drain 18 in one of the adjacent columns. These electrical connections also alternate. For example, in row 1, the drains 18 for columns 1-2, 3-4, 5-6, and so on are connected together. In rows 2-3, the drains 18 for columns 0-1, 2-3, 4-5, and so on are connected together. The connections can be diffusion connections extending through the isolations regions, as shown in FIG. 24. Alternately, metal connectors 38 can make the electrical connections, as shown in FIG. 25. Therefore, the two drain regions 18 for each pair of memory cells (sharing a common erase gate 16) are connected to two different bit lines 32.

FIG. 26 includes a table of operating voltages (including non-limiting examples of actual voltages) for programming and reading a selected memory cell (in this case memory cell M2, which corresponds to EG0, BL2 and CG0_A) for architecture #5. The erase voltage (VEGE on selected EG line) indicated in this figure will erase all the memory cells in the pair of rows containing the selected memory cell M2. FIG. 27 includes a second table of operating voltages which is the same as in FIG. 26, except a lower erase voltage VEGE is used, and a negative voltage VCGE is applied to the control gates during erase. In a read operation, selected BL, EG and CG lines of a selected cell pair are biased at selected read bias voltages, the other CG line of selected memory cell pair is biased at a pass read bias voltage, other unselected CG lines are biased at 0 Volts, and other BL lines are biased at 0 Volts. In a program operation, selected BL, EG and CG lines of the selected memory cell pair are biased at selected program bias voltages, the other BL line of the selected memory cell pair is biased at a program current, other unselected BLs are biased at an inhibit voltage VBLINH (or float or 0 Volts), the other CG of selected memory cell pair is biased at a pass program bias voltage, and other unselected CGs are biased at 0 volt.

Architecture #6

Figure 28:
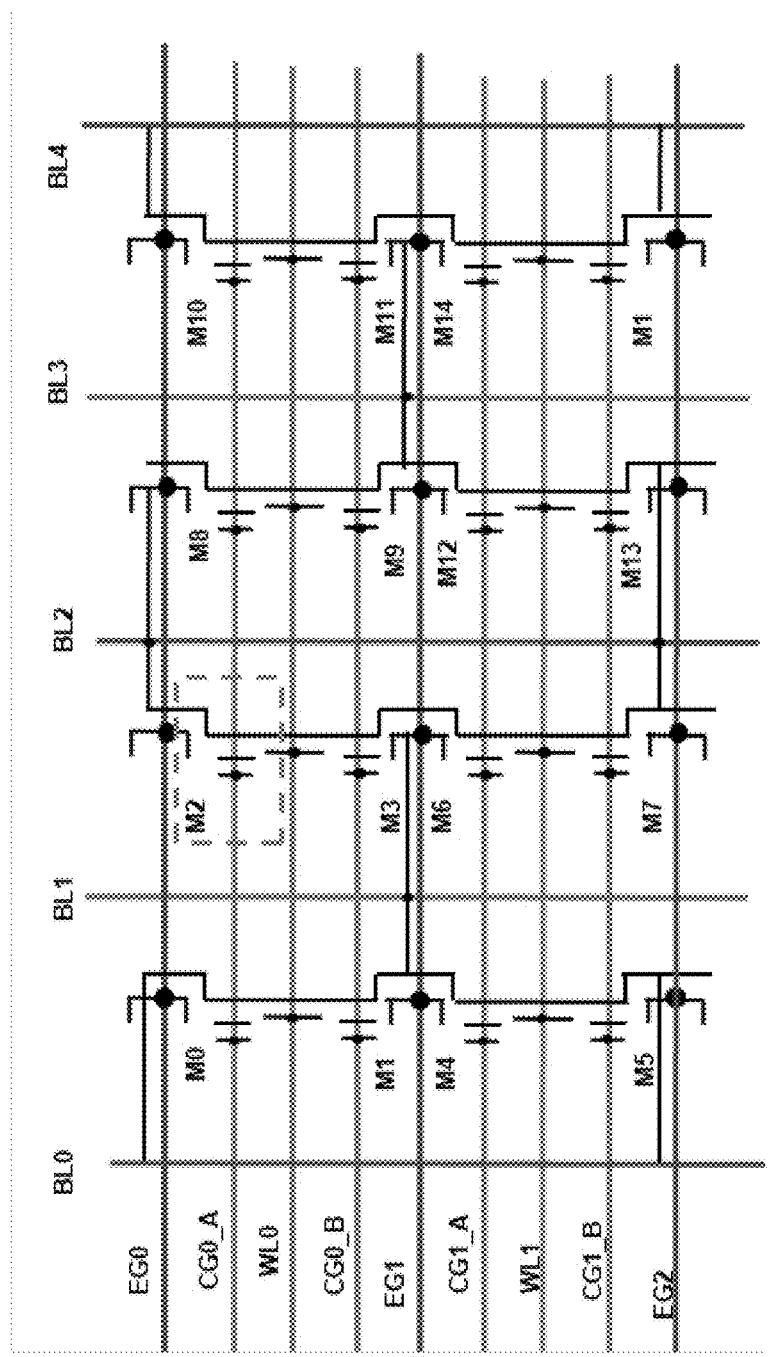
FIG. 28 is a schematic diagram of a sixth memory cell array architecture (architecture #6), applicable for Cell #3.
Figure 29:
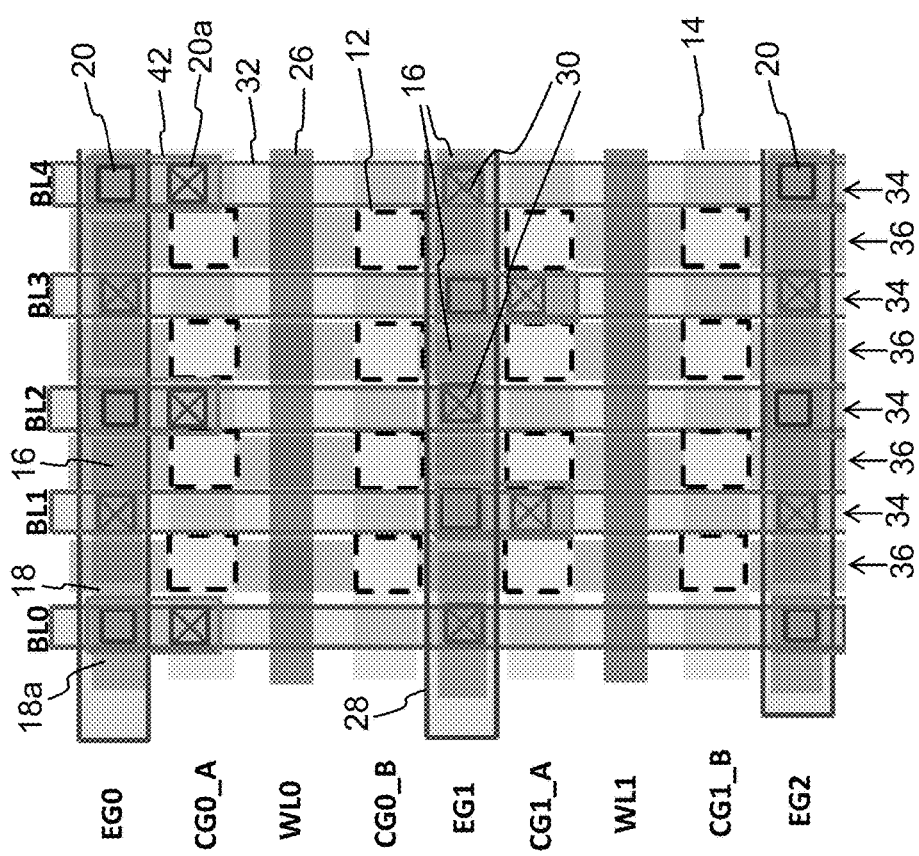
FIG. 29 is a plan view of the memory cell array layout for architecture #6.

FIG. 28 shows a sixth architecture (#6), and FIG. 29 shows the corresponding layout, which is applicable for Cell #3. In this configuration, the pairs of memory cells, formed in the active regions 36, extend vertically. The polysilicon word lines 26 (WL) and control gate poly lines 14 (CG) extend horizontally. Pairs of erase gates 16 (EG) are formed as poly lines that extend horizontally across the isolation region 34 between two different active regions 36 (i.e. pairs of EG gates 16 in the same row but different columns are formed by a single stripe of poly). An EG contact 30 connects each EG poly to a metal EG line 28 that extends over and connects to all EG polys in the same row. As with the previous architecture, there is a single vertical bit line 32 for each column of memory cells, where each bit line 32 is connected only to every other drain region 18 in the column by contacts 20. Similarly, there are diffusion connections 18a between alternating drain regions 18 of adjacent columns extending through the isolations regions 34. The drain 18 contacts to each diffusion connection are formed in the isolations regions 34, along with a metal bridge 42 connected thereto that extends downwardly to over one of the control gate lines, which is where a bit line contact 20a is formed that connects to a metal bit line 32 for that pair of columns. Each metal bit line 32 extends vertically over the isolation region 34 between the two columns of memory cells to which it connects. Therefore, the two drain regions 18 for each pair of memory cells (sharing a common erase gate) are connected to two different bit lines 32.

FIG. 30 includes a table of operating voltages (including non-limiting examples of actual voltages) for programming and reading a selected memory cell (in this case memory cell M2, which corresponds to EG0, BL2, WL0 and CG0_A) for architecture #6. The erase voltage (VEGE on selected EG line) indicated in this figure will erase all the memory cells in the pair of rows containing the selected memory cell M2. FIG. 31 includes a second table of operating voltages which is the same as in FIG. 30, except a lower erase voltage VEGE is used, and a negative voltage VCGE is applied to the control gates during erase. In a read operation, selected BL, WL, EG and CG lines of a selected cell pair are biased at selected read bias voltages, the other CG line of selected memory cell pair is biased at a pass read bias voltage, other unselected CG lines are biased at 0 Volts, other BL lines are biased at 0 Volts, and other unselected WL lines are biased at 0 Volts. In a program operation, selected BL, WL, EG and CG lines of the selected memory cell pair are biased at selected program bias voltages, the other BL line of the selected memory cell pair is biased at a program current, other unselected BLs are biased at an inhibit voltage VBLINH (or float or 0 Volt), the other CG of selected memory cell pair is biased at a pass program bias voltage, other unselected CGs are biased at an inhibit voltage VCGINH or 0 volts, and other unselected WL lines are biased at 0 Volts.

Figure 32:
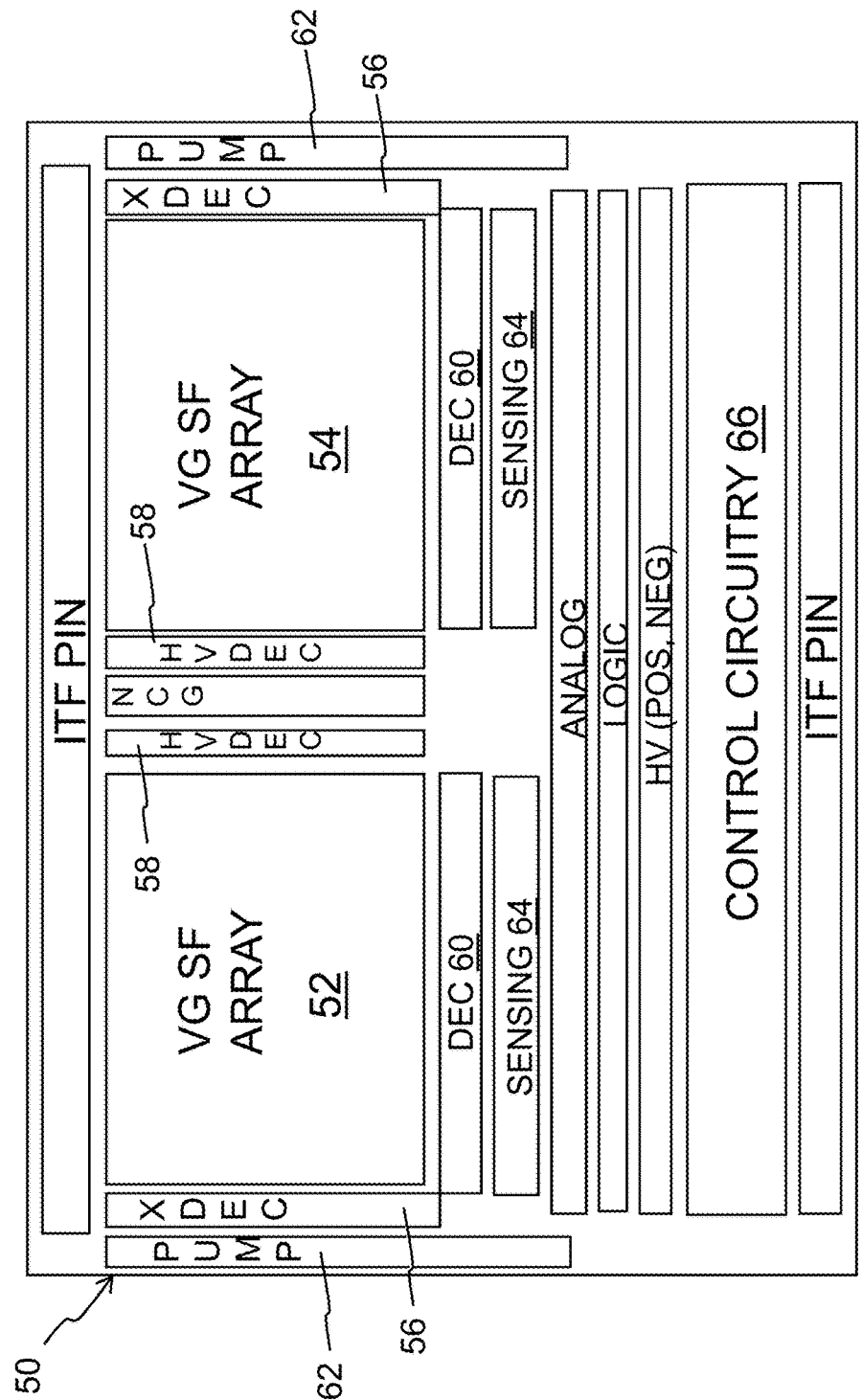
FIG. 32 is a plan view of the components of the memory cell device for all architectures.
Figure 33:
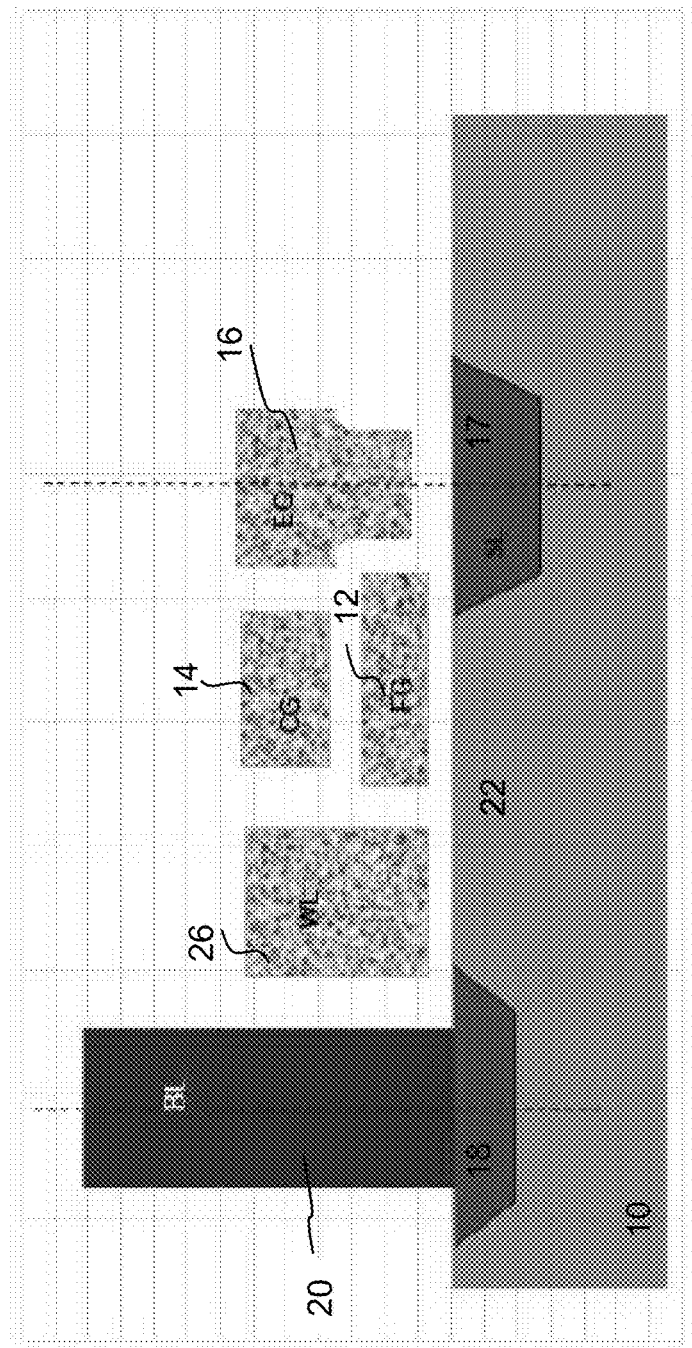
FIG. 33 depicts a prior art split gate flash memory cell.
Figure 37:
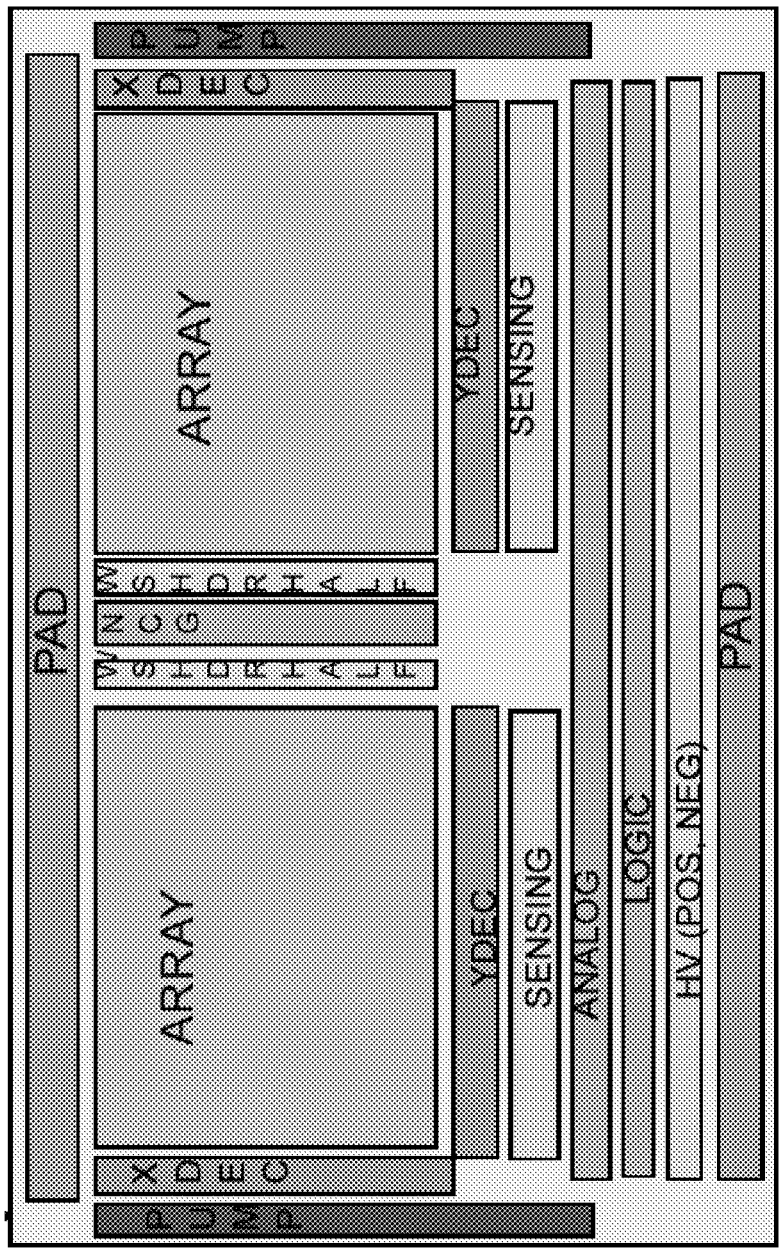
FIG. 37 depicts an exemplary prior art layout for a flash memory device comprising memory cells of the type shown in FIG. 33.

The components of memory device 50 according to any of the above six described architectures is illustrated in FIG. 32. The memory device 50 includes two separate arrays 52 and 54 of non-volatile memory cells according to any of the embodiments described above, formed on a single chip. Adjacent to the arrays 52 and 54 of non-volatile memory cells are address decoders 56, 58 and 60 used to decode addresses and supply the various voltages to the above described lines during read, program, and erase operations for selected memory cells. Charge pumps 62 supply voltages during operation. Sense amplifiers 64 are used to read memory cell channel currents during read operations to determine the state of the selected memory cell. Control circuitry 66 is configured to control the components of the memory device 50 to provide the various voltages and currents on the various lines described above during the read, program and erase operations.

Figure 38:
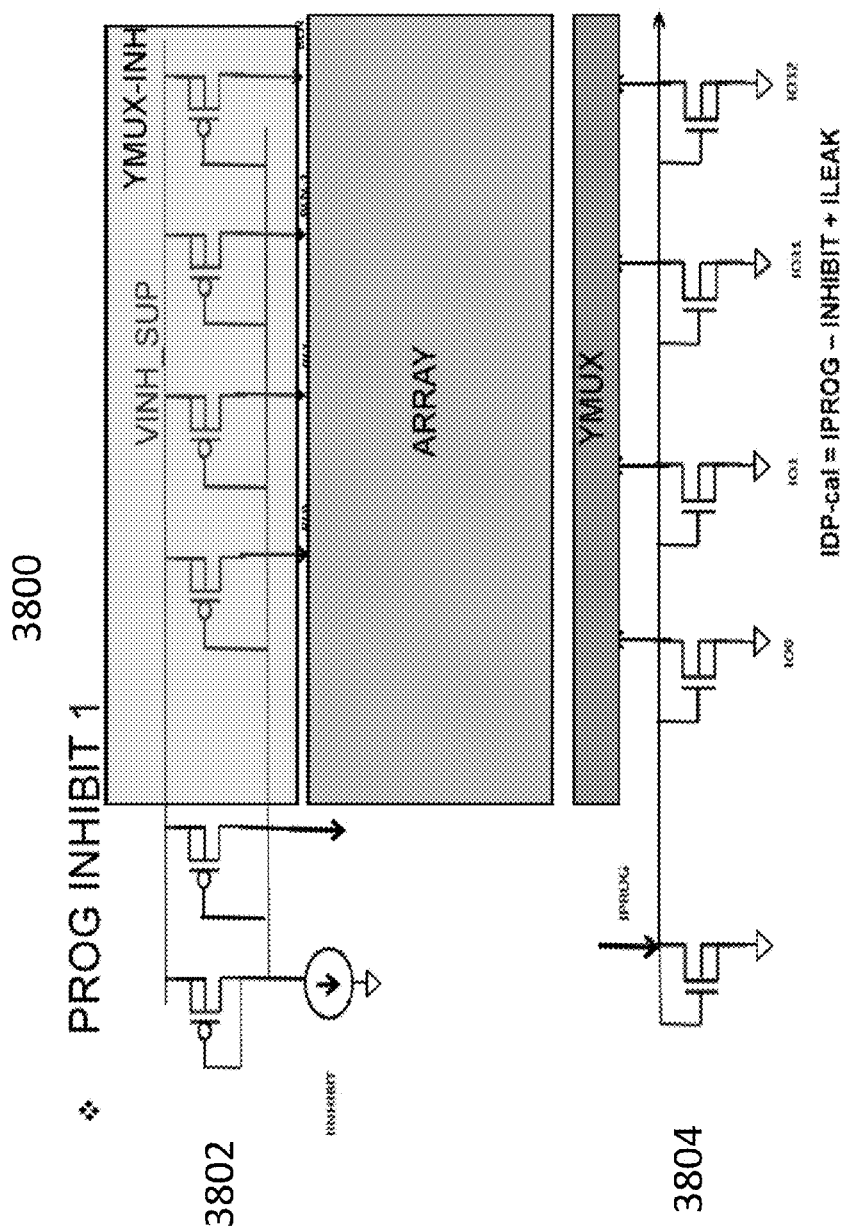
FIG. 38 depicts a first embodiment of a programming inhibit circuit.

FIG. 38 depicts a first embodiment for inhibiting the programming of unselected bit lines during the programming of a selected cell. Circuit 3800 comprises a plurality of current sources 3802 that serve to pull up the unselected bit lines during a programming operation by applying a current INHIBIT, which inhibits the programming of cells coupled to those bit lines. Each bit line is coupled to one of the current sources 3802. The current sources 3802 also couple to the selected bitlines. This decreases the programming current required to program cells that are on the column that contain the selected memory cell that is intended to be programmed. Current source 3804 applies a programming bias current IPROG to the selected cell during programming. The actual programming current used to program the selected memory cell is IDP-cal=IPROG−INHIBIT+ILEAK (where IDP is the calibrated programming current, and ILEAK is the leakage current).

Figure 39:
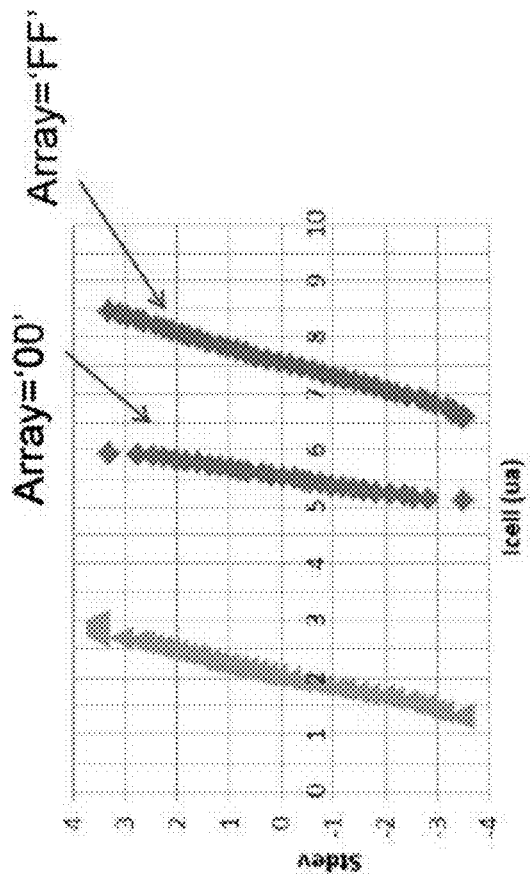
FIG. 39 depicts a graph of leakage current based on the value programmed into a selected cell.

FIG. 39 contains a graph depicting exemplary data of leakage current ILEAK in a selected bit line during a programming operation. The leakage current varies depending on the data that is programmed into the memory cells coupled to that bit line. For example, if the memory cells coupled to the bit line all are programmed with a "0," (shown as Array='00', aka ILEAK0), the leakage current is significant less than if the memory cells coupled to the bit line all are programmed with a "1" (shown as Array='FF', aka ILEAK1). If the memory cells are programmed with both "0s" and "1s," the leakage current is between the two leakage values ILEAK0 and ILEAK1. The difference between ILEAK1 and ILEAK0 is shown in as the data set on the far left.

Figure 40:
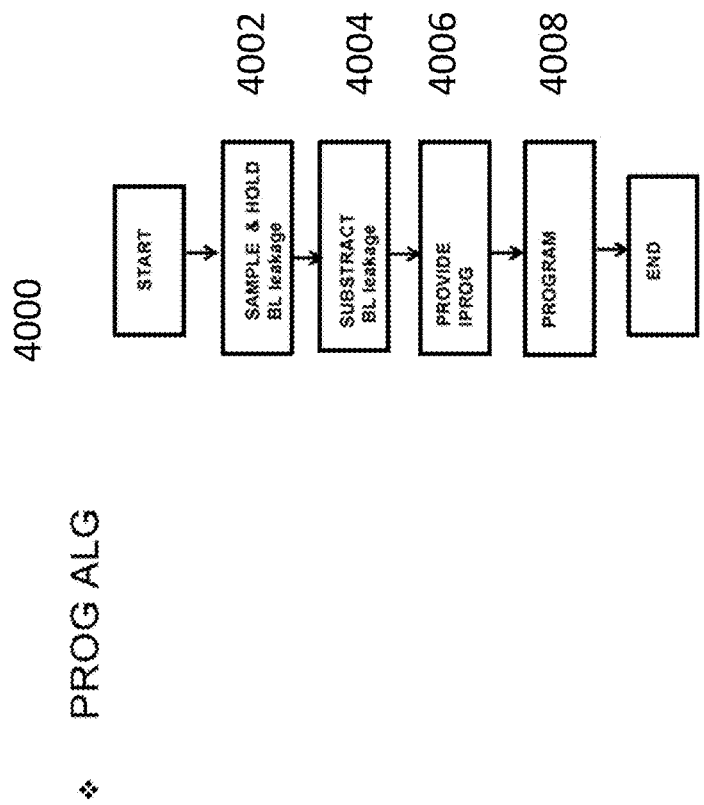
FIG. 40 depicts a method for compensating for leakage current that occurs during the programming of a selected cell.

FIG. 40 depicts a method 4000 for compensating for the leakage current ILEAK that occurs during a programming operation. Method 4000 recognizes that the leakage current may vary over time depending on the data being programmed. First, the bit line leakage current is sampled and held by a sample and hold circuit (step 4002). Second, the bit line leakage is compensated for by subtracting a current equal to the bit line leakage current from the bit line (step 4004). Third, the programming current, IPROG, is provided to the bit line (step 4006). Fourth, the selected cell is programmed (step 4008).

Figure 41:
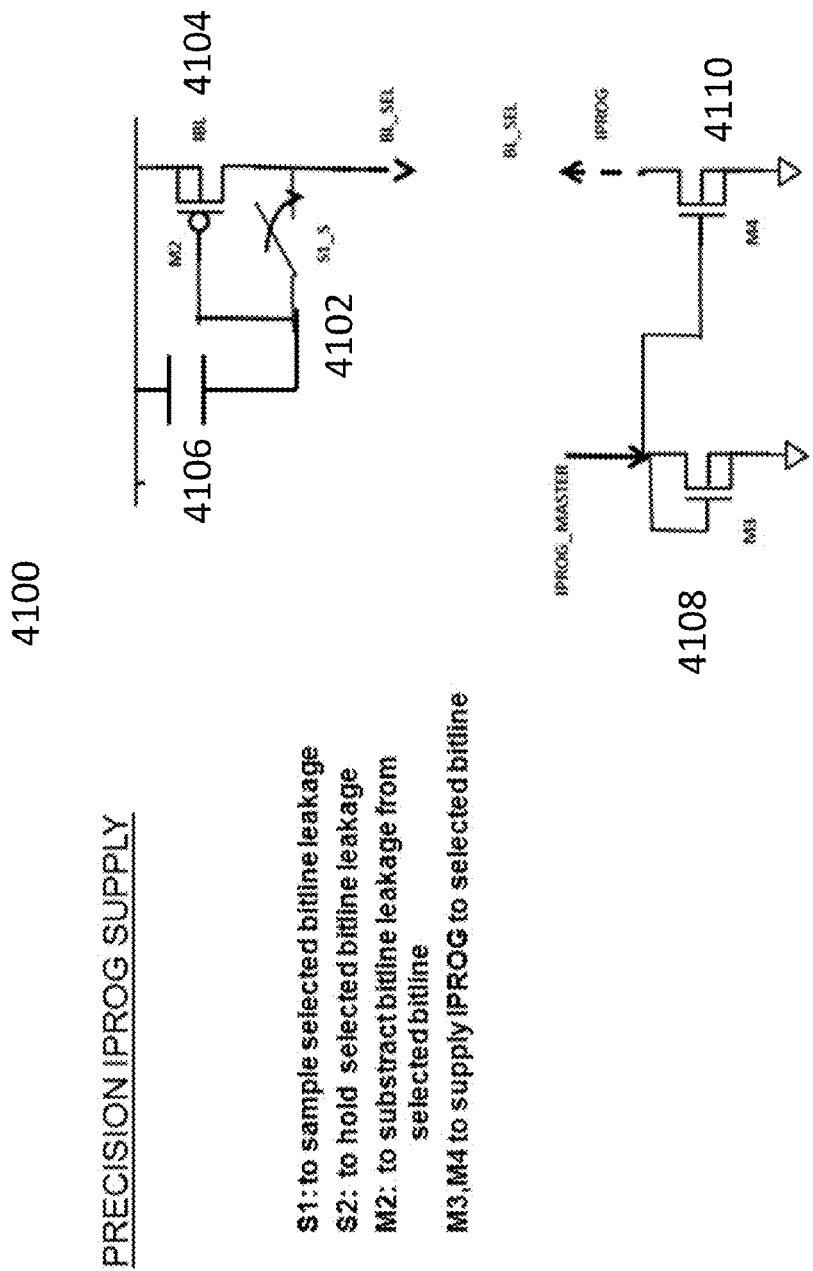
FIG. 41 depicts an embodiment of a programming circuit.

FIG. 41 depicts precision supply 4100 to supply current IPROG to program a selected cell. Precision supply 4100 can be used to implement the method of FIG. 40. Switch 4102 (S1) is closed to sample the selected bitline leakage ILEAK, the leakage information is stored in the form of a bias voltage on the gate of device 4104 (M2), modeled here as a charge stored on capacitor 4106. In another embodiment there is no capacitor 4106. In this case, the gate capacitance of the device 4104 (M2) serves to hold the sampling bias voltage. After sampling the leakage, the switch 4102 (S1) is open. Now the transistor 4104 (M2) injects a current, that is controlled by the stored leakage voltage on the gate of the transistor 4104 (M2), into the bitline. Effectively, transistor 4104 (M2) controls the subtraction of bitline leakage from the selected bitline. Transistors 4108 (M3) and 4110 (M4) provide current IPROG to the selected bitline to program the selected memory cell.

Figure 42:
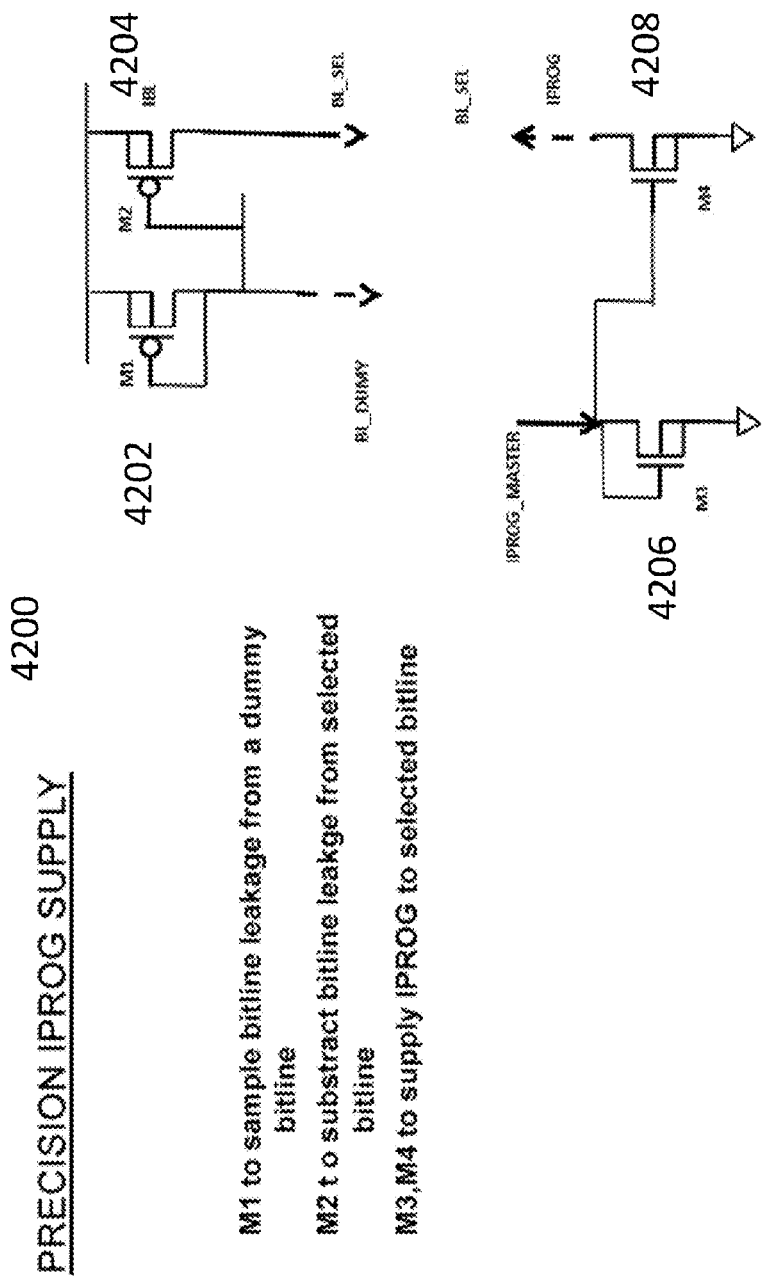
FIG. 42 depicts another embodiment of a programming circuit.

FIG. 42 depicts another precision supply 4102 to supply current IPROG to program a selected cell. Precision supply 4102 can be used to implement the method of FIG. 40. Transistor 4202 (M1) is used to sample the bitline leakage ILEAK from a dummy bitline. Transistor 4204 (M2) is used to subtract the same bitline leakage from the selected bitline, as transistors 4202 (M1) and 4204 (M2) are coupled in a current mirror configuration. Transistors 4206 (M3) and 4208 (M4) supply current IPROG to the selected bitline to program the selected memory cell.

Figure 43:
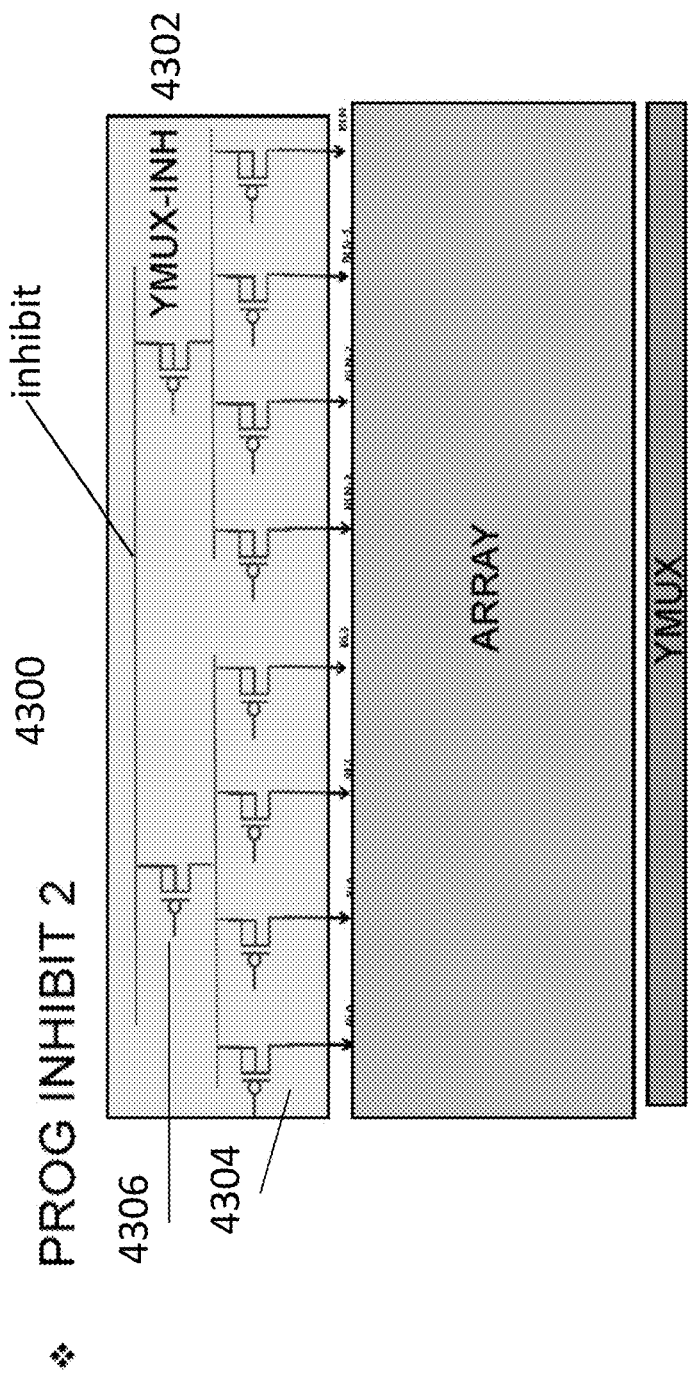
FIG. 43 depicts a second embodiment of a programming inhibit circuit.

FIG. 43 depicts a second embodiment for inhibiting the programming of unselected bit lines during the programming of a selected cell. Circuit 4300 comprises multiplexor (bitline inhibit decoder) 4302 for coupling an inhibit bias source (that can be current or voltage) to unselected bit lines during a programming operations, which inhibits the programming of cells coupled to those bit lines. In this embodiment, multiplexor 4302 comprises a PMOS transistor (such as exemplary PMOS transistor 4304) coupled to each bit line. The PMOS transistors can be grouped together, with each group connected to another PMOS transistor (such as exemplary PMOS transistor 4306) in a hierarchical decoding fashion to simplify the selection and unselection of bit lines. A separate bitline read decoder (not shown) is used for sensing memory cells from the bitlines.

Figure 44:
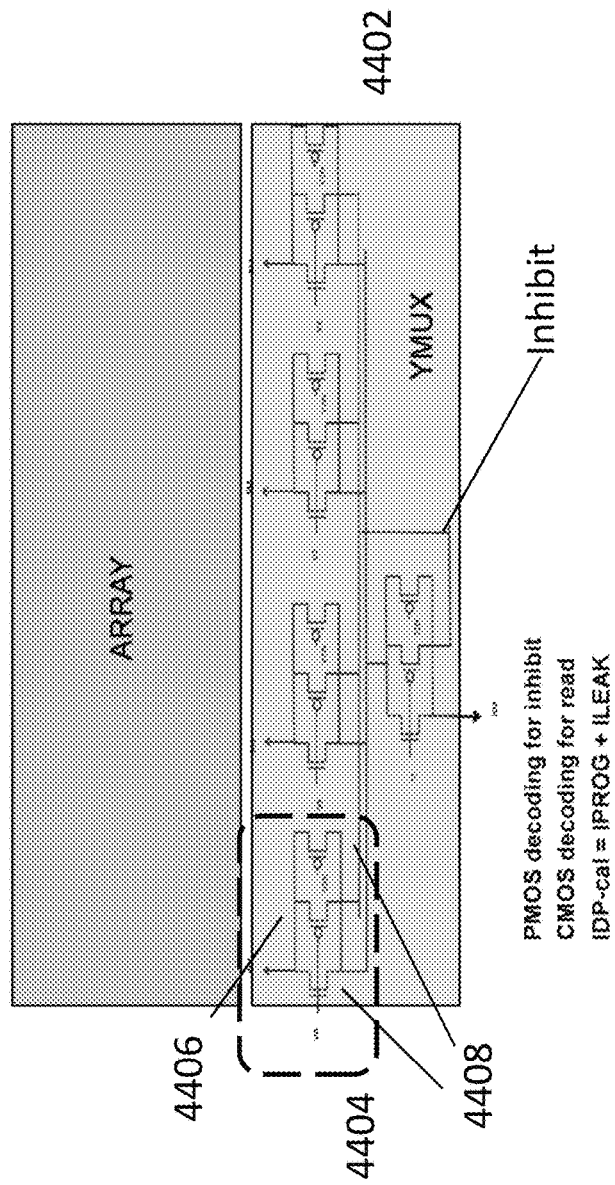
FIG. 44 depicts a third embodiment of a programming inhibit circuit.

FIG. 44 depicts a third embodiment for inhibiting the programming of unselected bit lines during the programming of a selected cell. Circuit 4400 comprises multiplexor (combined inhibit and read bitline decoder) 4402 that couples each bit line to a bitline inhibit decoder PMOS circuit (such as exemplary PMOS circuit 4406) that is part of a decoder circuit (such as exemplary decoder circuit 4404) for coupling an inhibit bias source (that can be current or voltage) to unselected bit lines during a programming operations, which inhibits the programming of cells coupled to those bit lines. Each bit line also is coupled to a bitline read decoder CMOS circuit (such as exemplary CMOS circuit 4408) that is part of a decoder circuit used during read operations.

Figure 45:
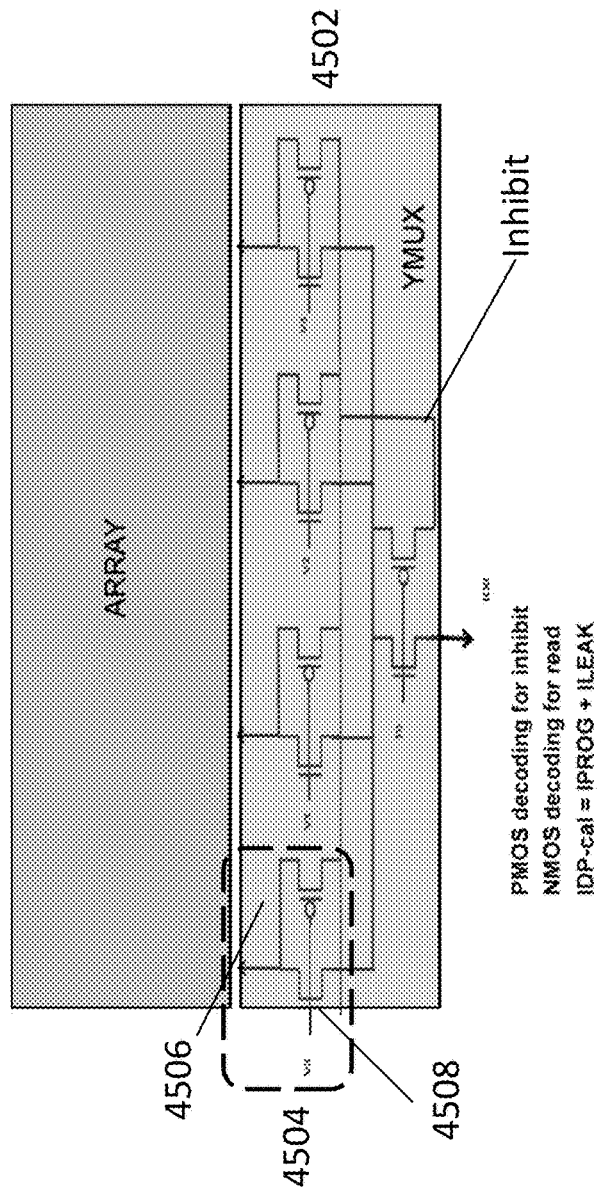
FIG. 45 depicts a fourth embodiment of a programming inhibit circuit.

FIG. 45 depicts a fourth embodiment for inhibiting the programming of unselected bit lines during the programming of a selected cell. Circuit 4500 comprises multiplexor (combined inhibit and read bitline decoder) 4502 that couples each bit line to a bitline inhibit decoder PMOS circuit (such as exemplary PMOS circuit 4506) that is part of a decoder circuit (such as exemplary decoder circuit 4504) for coupling an inhibit bias source (that can be current or voltage) to unselected bit lines during a programming operations, which inhibits the programming of cells coupled to those bit lines. Each bit line also is coupled to a bitline read decoder NMOS circuit (such as exemplary NMOS circuit 4508) that is part of a decoder circuit used during read operations.

Figure 46:
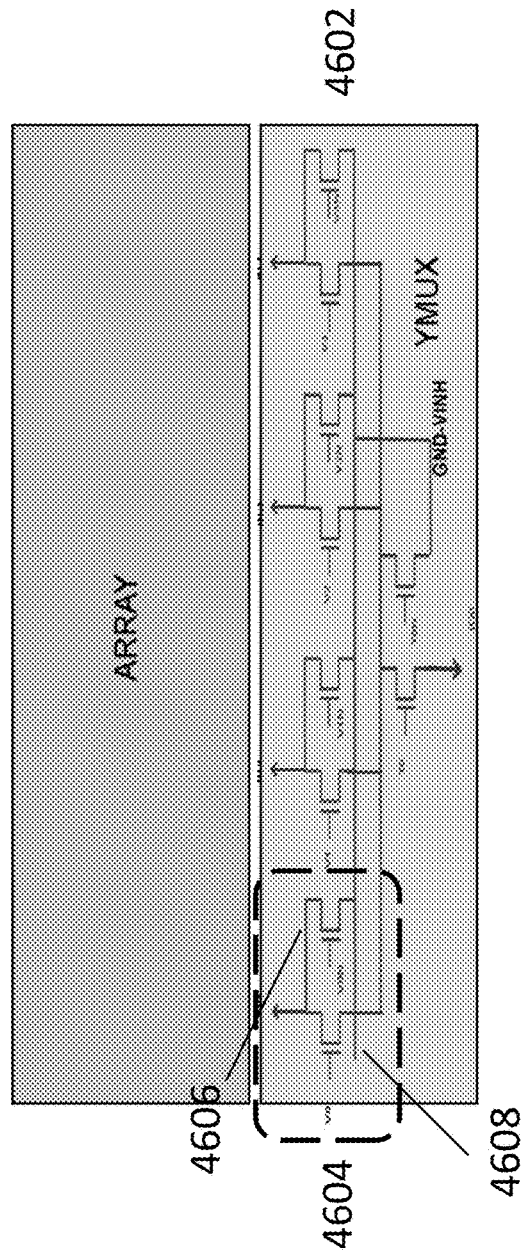
FIG. 46 depicts a fifth embodiment of a programming inhibit circuit.

FIG. 46 depicts a fifth circuit embodiment for inhibiting the programming of unselected bit lines during the programming of a selected cell. Circuit 4600 comprises multiplexor (combined inhibit and read NMOS bitline decoder) 4602 that couples each bit line to an NMOS circuit (such as exemplary NMOS circuit 4606 that serves both inhibit and read deselection functions) that is part of a decoder circuit (such as exemplary decoder circuit 4604) for coupling an inhibit bias source (that can be current or voltage) to unselected bit lines during a programming operations, which inhibits the programming of cells coupled to those bit lines. The NMOS circuit 4605 also serves in read to de-select the un-selected bitlines to a low level such as ground. Each bit line also is coupled to a NMOS circuit (such as exemplary NMOS circuit 4508) that is part of a decoder circuit used during read operations.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell array of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A flash memory device, comprising:
an array of flash memory cells organized into rows and columns, each column of flash memory cells coupled to a bit line;
a programming circuit coupled to the array to apply a programming current to a selected bit line; and
a programming inhibit circuit coupled to the array to apply an inhibit bias source to unselected bit lines;
wherein during a programming operation a selected cell coupled to the selected bit line is programmed but all cells coupled to the unselected bit lines are not programmed; and
wherein the programming inhibit circuit comprises:
a first set of PMOS transistors, wherein each bit line is coupled to a PMOS transistor in the first set of PMOS transistors to receive an inhibit bias source; and
a second set of PMOS transistors, wherein each PMOS transistor in the second set of PMOS transistors is coupled to a plurality of PMOS transistors in the first set of PMOS transistors to provide the inhibit bias source.

2. The flash memory device of claim 1, wherein the inhibit bias source is a current source.

3. The flash memory device of claim 1, wherein the inhibit bias source is a voltage source.

4. The flash memory device of claim 1, wherein each memory cell is a source side injection flash memory cell.

5. The flash memory device of claim 1, wherein each memory cell is a source side injection flash memory cell with tip erase.

6. The flash memory device of claim 1, wherein the memory cells are arranged in pairs, each pair comprising two floating gates sharing an erase gate.

7. The flash memory device of claim 1, wherein the memory cells are arranged in pairs, each pair comprising two floating gates sharing a wordline.

8. A flash memory device, comprising:
an array of flash memory cells organized into rows and columns, each column of flash memory cells coupled to a bit line;
a programming circuit coupled to the array to apply a programming current to a selected bit line, the programming circuit comprising:
a current mirror comprising a first transistor and a second transistor, the first transistor coupled to a programming current source and the second transistor coupled to the selected bit line;
a circuit for sampling a leakage current and injecting the leakage current into the selected bit line; and
a programming inhibit circuit coupled to the array to apply an inhibit bias source to unselected bit lines;
wherein during a programming operation a selected cell coupled to the selected bit line is programmed but all cells coupled to the unselected bit lines are not programmed; and
wherein the circuit for sampling a leakage current comprises a current mirror comprising a third transistor and a fourth transistor, the third transistor coupled to a dummy bitline to sample leakage current and the second transistor coupled to the selected bit line.

9. The flash memory device of claim 8, wherein the inhibit bias source is a current source.

10. The flash memory device of claim 8, wherein the inhibit bias source is a voltage source.

11. The flash memory device of claim 8, wherein each memory cell is a source side injection flash memory cell.

12. The flash memory device of claim 8, wherein each memory cell is a source side injection flash memory cell with tip erase.

13. The flash memory device of claim 8, wherein the memory cells are arranged in pairs, each pair comprising two floating gates sharing an erase gate.

14. The flash memory device of claim 8, wherein the memory cells are arranged in pairs, each pair comprising two floating gates sharing a wordline.

* * * * *